US009653315B2

(12) United States Patent
Sills et al.

(10) Patent No.: US 9,653,315 B2
(45) Date of Patent: *May 16, 2017

(54) METHODS OF FABRICATING SUBSTRATES

(71) Applicant: Micron Technology, Inc., Boise, ID (US)

(72) Inventors: Scott Sills, Boise, ID (US); Gurtej S. Sandhu, Boise, ID (US); Anton deVilliers, Clifton Park, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/445,478

(22) Filed: Jul. 29, 2014

(65) Prior Publication Data

US 2014/0335694 A1    Nov. 13, 2014

Related U.S. Application Data

(63) Continuation of application No. 12/328,448, filed on Dec. 4, 2008, now Pat. No. 8,796,155.

(51) Int. Cl.
*H01L 21/302* (2006.01)
*H01L 21/308* (2006.01)
(Continued)

(52) U.S. Cl.
CPC ............ *H01L 21/3088* (2013.01); *G03F 7/40* (2013.01); *H01L 21/0273* (2013.01);
(Continued)

(58) Field of Classification Search
CPC ............. H01L 21/3085; H01L 21/3065; H01L 21/3086; H01L 21/308; H01L 21/3088;
(Continued)

(56) References Cited

U.S. PATENT DOCUMENTS 4,910,168 A    3/1990   Tsai
5,008,207 A    4/1991   Blouse et al.
(Continued)

FOREIGN PATENT DOCUMENTS

CN    1550889    12/2004
CN    1752844    3/2006
(Continued)

OTHER PUBLICATIONS

U.S. Appl. No. 11/714,378, filed Mar. 5, 2007, Preliminary Amendment.
(Continued)

*Primary Examiner* — Lan Vinh
(74) *Attorney, Agent, or Firm* — Wells St. John P.S.

(57)    ABSTRACT

A method of fabricating a substrate includes forming spaced first features over a substrate. An alterable material is deposited over the spaced first features and the alterable material is altered with material from the spaced first features to form altered material on sidewalls of the spaced first features. A first material is deposited over the altered material, and is of some different composition from that of the altered material. The first material is etched to expose the altered material and spaced second features comprising the first material are formed on sidewalls of the altered material. Then, the altered material is etched from between the spaced second features and the spaced first features. The substrate is processed through a mask pattern comprising the spaced first features and the spaced second features. Other embodiments are disclosed.

41 Claims, 13 Drawing Sheets

(51) Int. Cl.
  *G03F 7/40* (2006.01)
  *H01L 21/027* (2006.01)
  *H01L 21/033* (2006.01)
  *H01L 21/311* (2006.01)

(52) U.S. Cl.
  CPC ...... *H01L 21/0337* (2013.01); *H01L 21/0338* (2013.01); *H01L 21/3086* (2013.01); *H01L 21/31138* (2013.01)

(58) Field of Classification Search
  CPC ............. H01L 21/31138; H01L 21/033; H01L 21/0338; G03F 7/40
  USPC ....... 438/591, 595, 624, 625, 639, 712, 720, 438/719, 736, 737; 216/41, 47, 49, 72; 430/310, 312
  See application file for complete search history.

(56) References Cited

U.S. PATENT DOCUMENTS

| | | |
|---|---|---|
| 5,013,680 A | 5/1991 | Lowrey et al. |
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A | 10/2000 | Jones et al. |
| 6,174,818 B1 | 1/2001 | Tao et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,429,123 B1 | 8/2002 | Tseng |
| 6,455,433 B1 | 9/2002 | Chang et al. |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Juengling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottsegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 6,977,404 B2 | 12/2005 | Katsumata et al. |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,074,533 B2 | 7/2006 | Fuller et al. |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,271,108 B2 | 9/2007 | Sadjadi |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,651,951 B2 | 1/2010 | Tran et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,807,575 B2 | 10/2010 | Zhou |
| 7,842,601 B2 * | 11/2010 | Lee et al. ............... 438/622 |
| 7,846,646 B2 | 12/2010 | Kamijima |
| 7,851,135 B2 | 12/2010 | Jung et al. |
| 7,855,038 B2 | 12/2010 | Hah et al. |
| 7,897,460 B2 | 3/2011 | Parekh et al. |
| 7,902,074 B2 | 3/2011 | Niroomand et al. |
| 7,923,371 B2 | 4/2011 | Shinohe |
| 7,959,818 B2 | 6/2011 | Jung |
| 8,012,675 B2 * | 9/2011 | Yang ............... G03F 7/40 430/299 |
| 8,067,286 B2 | 11/2011 | Parekh et al. |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,247,302 B2 | 8/2012 | Sills |
| 8,273,634 B2 | 9/2012 | Sills |
| 8,338,304 B2 | 12/2012 | Zhou |
| 8,440,576 B2 | 5/2013 | Hong |
| 8,629,048 B1 | 1/2014 | Sipani et al. |
| 8,629,527 B2 | 1/2014 | Parekh et al. |
| 8,796,155 B2 * | 8/2014 | Sills et al. ............... 438/736 |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2002/0130348 A1 | 9/2002 | Tran |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |

(56) References Cited

U.S. PATENT DOCUMENTS

| | | |
|---|---|---|
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jin |
| 2005/0214683 A1 | 9/2005 | Nishimura et al. |
| 2005/0215040 A1 | 9/2005 | Doyle |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1* | 7/2008 | Hah et al. .................. 430/9 |
| 2008/0176406 A1 | 7/2008 | Ikeda et al. |
| 2008/0193658 A1 | 8/2008 | Millward |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1* | 12/2008 | Kim et al. ................. 438/696 |
| 2009/0011374 A1* | 1/2009 | Chang et al. ............... 430/323 |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1* | 5/2009 | Yang ..................... G03F 7/40 430/327 |
| 2009/0130852 A1 | 5/2009 | Kewley |
| 2009/0212016 A1 | 8/2009 | Cheng et al. |
| 2009/0214823 A1 | 8/2009 | Cheng et al. |
| 2009/0291397 A1 | 11/2009 | deVilliers |
| 2009/0298274 A1 | 12/2009 | Kajiware |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0093175 A1 | 4/2010 | Niroomand et al. |
| 2010/0124826 A1 | 5/2010 | Millward et al. |
| 2010/0129980 A1 | 5/2010 | Sandhu et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1 | 6/2011 | Cheng et al. |
| 2013/0009283 A1 | 1/2013 | Zhou |
| 2013/0078574 A1 | 3/2013 | Peeters et al. |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590.X | 2/2013 |
| CN | 201080013110.1 | 5/2013 |
| CN | 201410270158.0 | 5/2016 |
| EP | 0171111 | 2/1986 |
| EP | 1273974 | 10/2003 |
| EP | 09830819.0 | 3/2013 |
| EP | 10756541.8 | 5/2013 |
| EP | 09743197.7 | 6/2013 |
| EP | 09830818.2 | 7/2013 |
| EP | 098308120.8 | 8/2013 |
| JP | 56046531 | 4/1981 |

(56) References Cited

FOREIGN PATENT DOCUMENTS

| | | |
|---|---|---|
| JP | 58157135 | 9/1983 |
| JP | 59211231 | 11/1984 |
| JP | 64035916 | 7/1989 |
| JP | 1-292829 | 11/1989 |
| JP | 3270227 | 12/1991 |
| JP | 06-077180 | 3/1994 |
| JP | 6275577 A | 9/1994 |
| JP | 2002-217170 | 8/2002 |
| JP | 2003234279 | 8/2003 |
| JP | 2004134574 A | 4/2004 |
| JP | 2004247399 | 9/2004 |
| JP | 2005-243681 | 9/2005 |
| JP | 2006245625 | 9/2006 |
| JP | 2007017993 | 1/2007 |
| JP | 2007294511 | 11/2007 |
| JP | 2007305976 | 11/2007 |
| JP | 2008-072097 | 3/2008 |
| JP | 2008-072101 | 3/2008 |
| JP | 2009289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0024053 | 3/2008 |
| KR | 10-2008-0039006 | 5/2008 |
| KR | 20080038963 A | 5/2008 |
| SG | 201300853-7 | 6/2013 |
| TW | 200702903 | 1/2007 |
| TW | 200818405 | 4/2008 |
| TW | 200834660 | 8/2008 |
| TW | 098113229 | 9/2012 |
| TW | 098139941 | 12/2012 |
| TW | 098139943 | 12/2012 |
| TW | 099140232 | 7/2013 |
| TW | 098139942 | 12/2013 |
| WO | 2006/104654 | 10/2006 |
| WO | WO2007/027558 | 3/2007 |
| WO | 2008/008338 | 1/2008 |
| WO | WO PCT/US2007/015729 | 1/2008 |
| WO | 2008/059440 | 5/2008 |
| WO | WO PCT/US2009/039793 | 10/2009 |
| WO | WO PCT/US2009/041500 | 12/2009 |
| WO | WO PCT/US2009/063978 | 5/2010 |
| WO | WO PCT/US2009/063999 | 5/2010 |
| WO | WO PCT/US2009/064004 | 5/2010 |
| WO | WO PCT/US2010/025495 | 9/2010 |
| WO | WO PCT/US2009/039793 | 11/2010 |
| WO | WO PCT/US2009/041500 | 12/2010 |
| WO | WO PCT/US2009/063978 | 6/2011 |
| WO | WO PCT/US2009/063999 | 6/2011 |
| WO | WO PCT/US2009/064004 | 6/2011 |
| WO | WO PCT/US2010/055488 | 6/2011 |
| WO | WO PCT/US2010/025495 | 9/2011 |
| WO | WO PCT/US2010/055488 | 6/2012 |

OTHER PUBLICATIONS

U.S. Appl. No. 13/101,485, filed May 5, 2011, Light et al.
Clariant, Polysilazane SODs Spinful 400 Series for STI/PMD Application; Oct. 19, 2009; 1 pp.
EE et al., "Innovative Solutions to Enhance the Legacy Equipments Towards One Generation Ahead in Flip Chip BGA 0.8mm Ball Pitch Technology", Sep. 2005; 4 pp.
Fritze et al., "Enhanced Resosulation for Future Fabrication", Jan. 2003, 5 pp.
Gallia et al., "A Flexible Gate Array Architecture for High-speed and High-Density Applications", Mar. 1996, pp. 430-436.
Hori et al., "Sub-40nm Half-Pitch Double Patterning with Resist Freezing Process", 2008 8 pp.
Lee et al., "Double-Patterning Technique Using Plasma Treatment of Photoresist", Sep. 20, 2007, 5 pp.
Liau et al., "Softbake and Post-exposure Bake Optimization for Process Window Improvement and Optical Proximity Effect Tuning", 2006, 7 pp.
Lu, "Advanced Cell Structuresw for Dynamic RAMs", Jan. 1989, pp. 27-36.
Ma, "Plasma Resist Image Stabilization Technique (PRIST)", 1980, 2 pp.
Owa et al., "Immersion Lithography Ready for 45nm Manufacturing and Beyond", 2007, pp. 238-244.
Pease et al., "Lithography and Other Patterning Techniques for Future Electronics", Feb. 2008, pp. 248-270.
Tan et al., "Current Status of Nanonex Nanoimprint Solutions", 2004, 9 pp.
Terai et al., "Newly developed RELACS Process and materials for 64 nm node device and beyond"; Oct. 2005; pp. 20-21.
0.1μm Level Contact Hole Pattern Formation with KrF Lithography by Resolution Enhancement Lithography Assistedby Chemical Shrink (RELACS); Toyoshima et al.; IEEE; 1998; pp. 12.5.1-12.5.4.

* cited by examiner

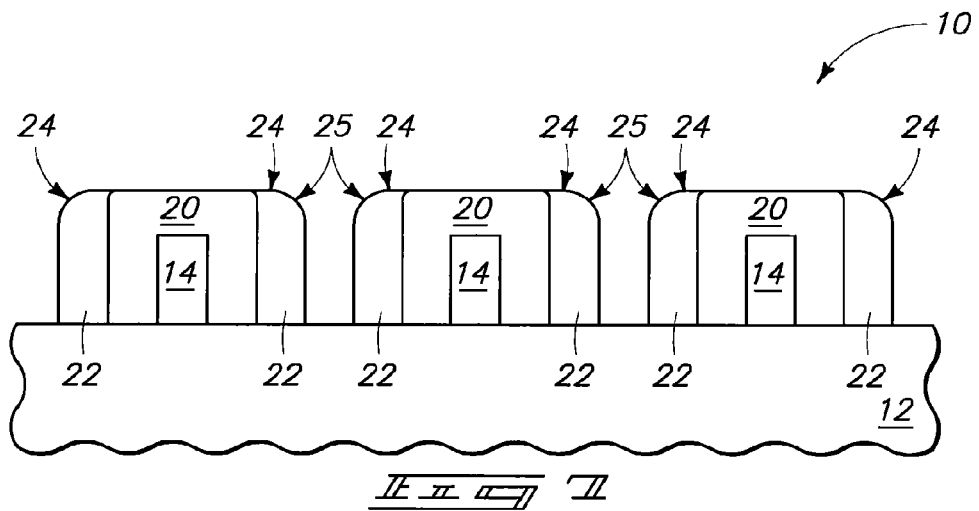
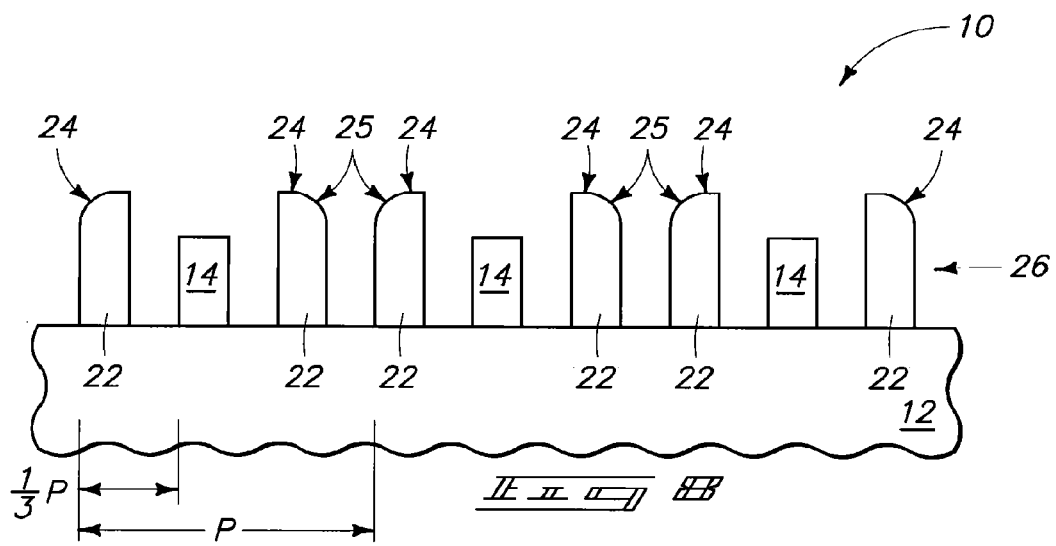
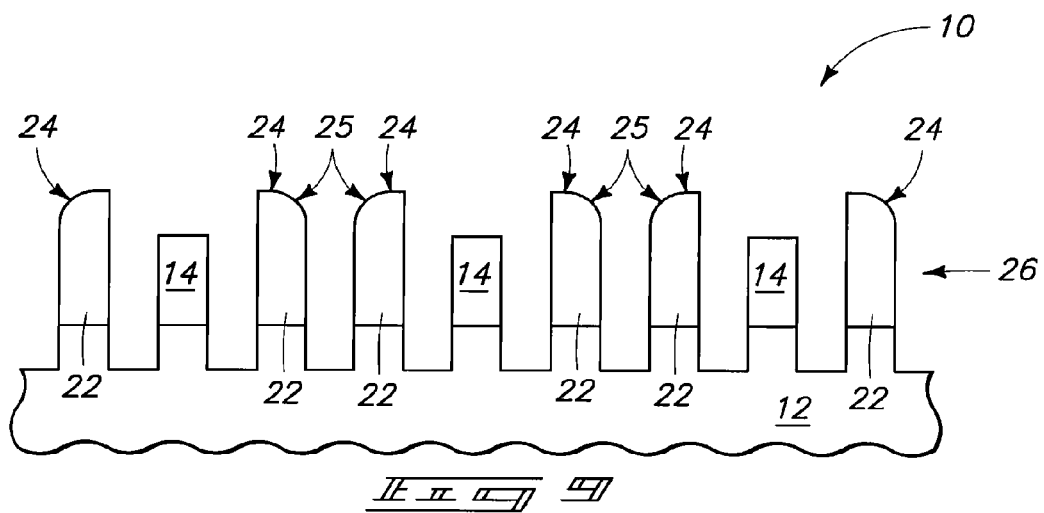

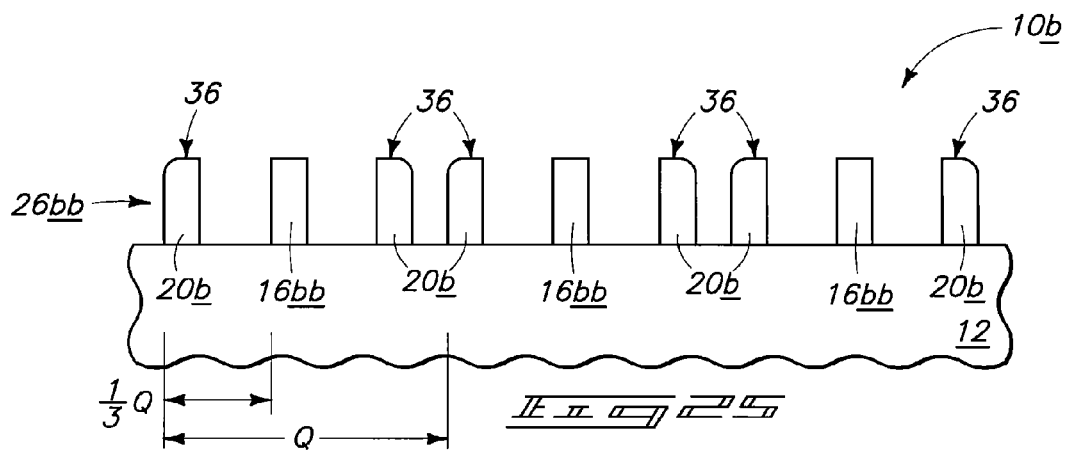
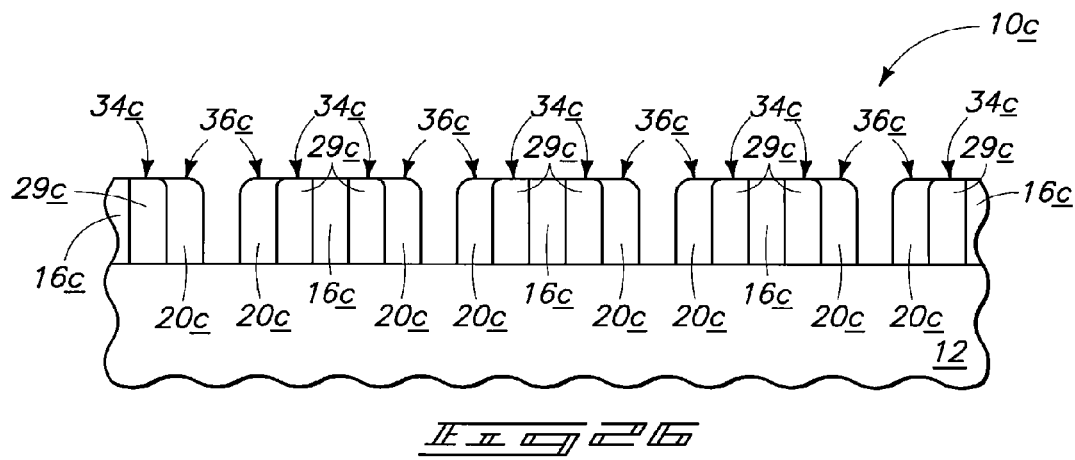
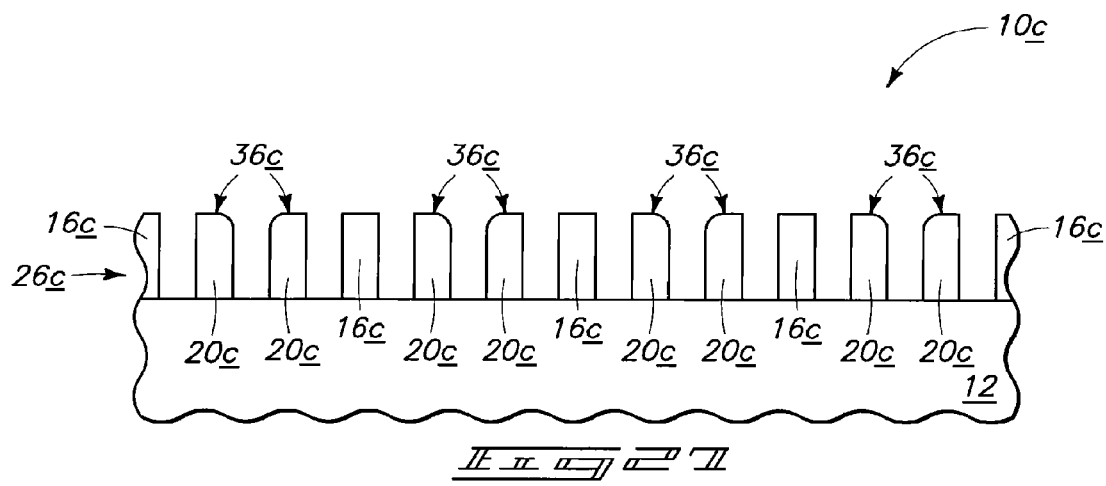

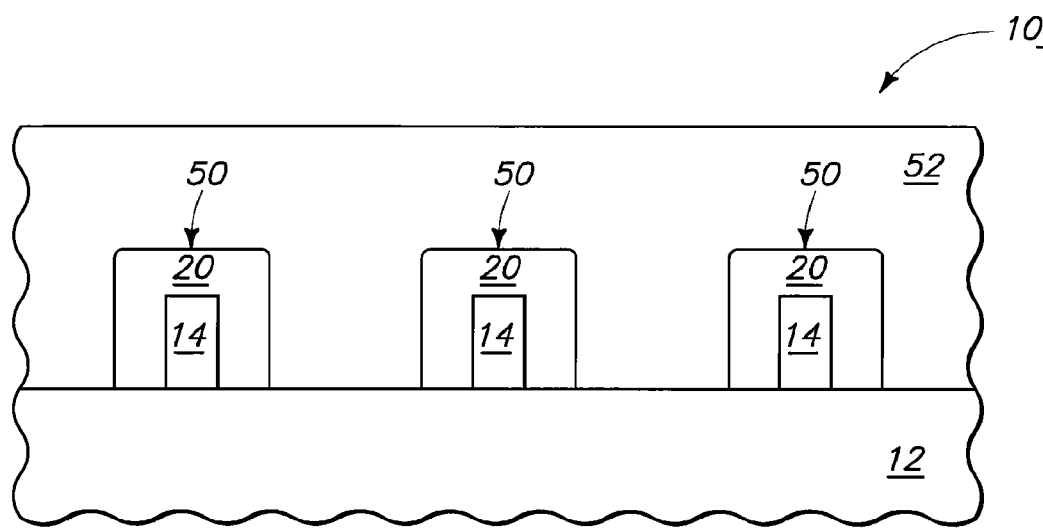
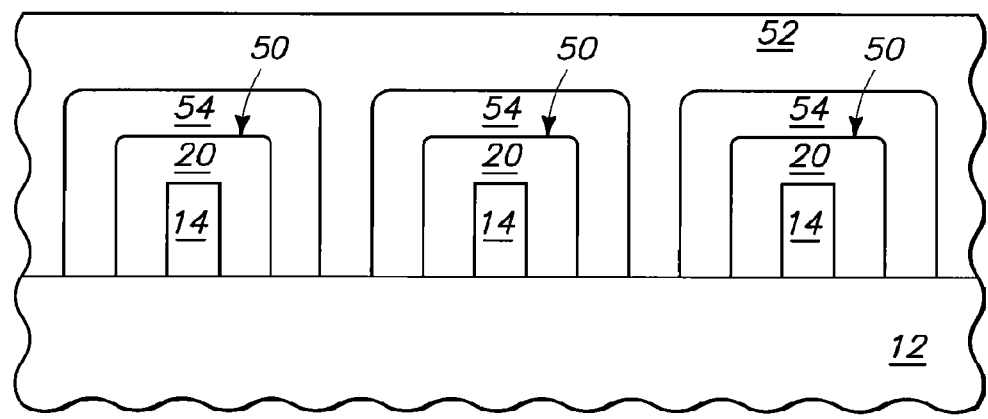
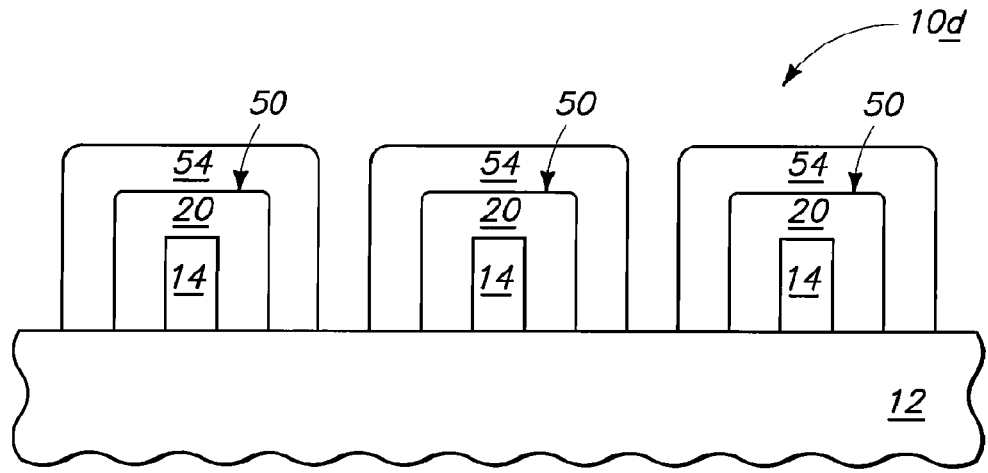

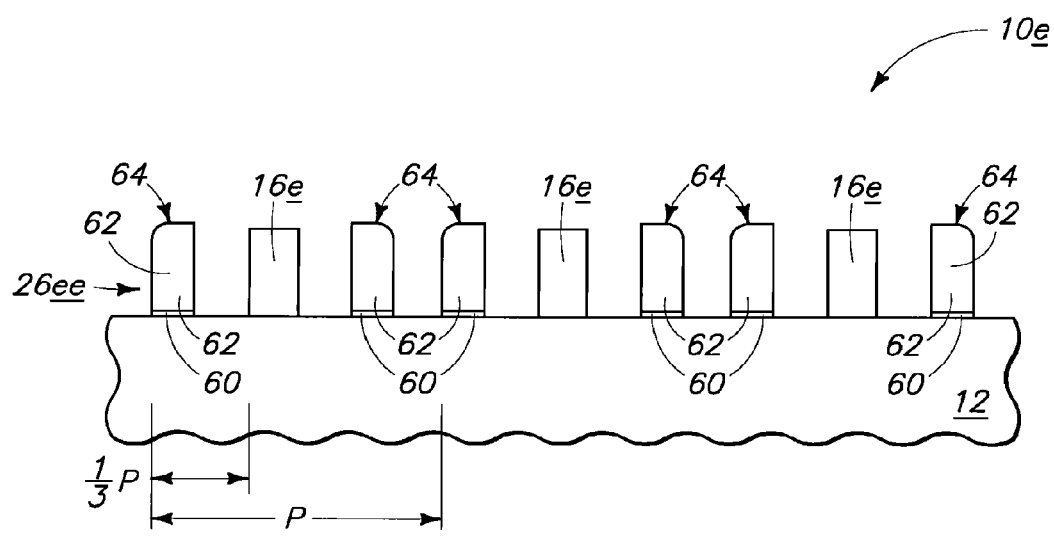
F I G 3 1

METHODS OF FABRICATING SUBSTRATES

RELATED PATENT DATA

This application is a continuation of U.S. patent application Ser. No. 12/328,448, which was filed on Dec. 4, 2008, entitled Methods of Fabricating Substrates, listing Scott Sills, Gurtej S. Sandhu, and Anton deVilliers as inventions, and which is incorporated herein by reference.

TECHNICAL FIELD

Embodiments disclosed herein pertain to methods of fabricating substrates, for example as may be used in the fabrication of integrated circuitry.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized.

The continual reduction in feature sizes places ever greater demands on the techniques used to form the features. For example, photolithography is commonly used to form patterned features, such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing spacer-forming layers to have a lateral thickness which is less than that of the minimum capable photolithographic feature size. The spacer-forming layers are commonly anisotropically etched to form sublithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times and also of fractional values other than integers. Thus, conventionally, "multiplication" of pitch by a certain factor actually involves reducing the pitch by that factor.

BRIEF DESCRIPTION OF THE DRAWINGS

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a view of the FIG. 8 substrate at a processing step subsequent to that shown by FIG. 8.

FIG. 25 is a view of the FIG. 24 substrate at a processing step subsequent to that shown by FIG. 24.

FIG. 26 is a diagrammatic sectional view of another substrate in process in accordance with an embodiment of the invention.

FIG. 27 is a view of the FIG. 26 substrate at a processing step subsequent to that shown by FIG. 26.

FIG. 28 is a diagrammatic sectional view of another substrate in process in accordance with an embodiment of the invention.

FIG. 29 is a view of the FIG. 28 substrate at a processing step subsequent to that shown by FIG. 28.

FIG. 30 is a view of the FIG. 29 substrate at a processing step subsequent to that shown by FIG. 29.

FIG. 37 is a view of the FIG. 36 substrate at a processing step subsequent to that shown by FIG. 36.

DETAILED DESCRIPTION OF EXAMPLE EMBODIMENTS

Figure 1:
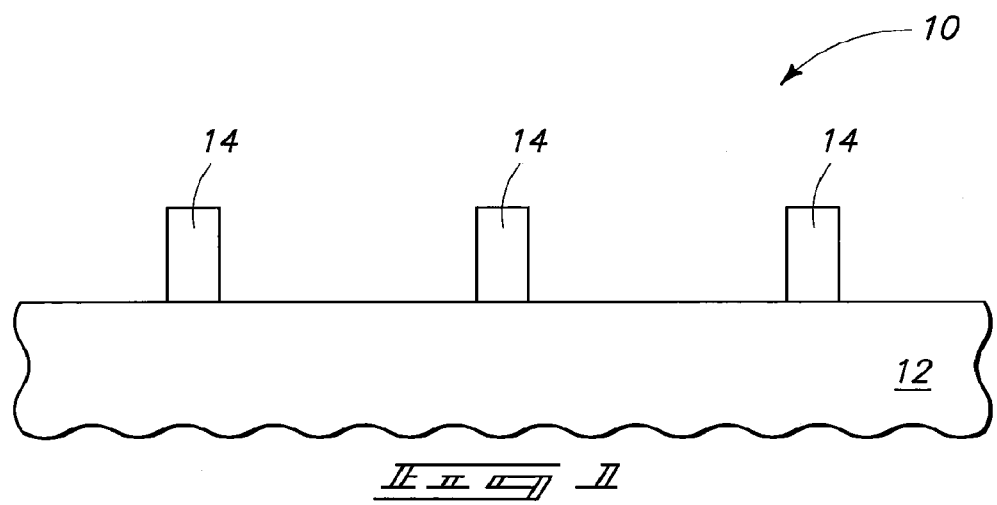
FIG. 1 is a diagrammatic sectional view of a substrate in process in accordance with an embodiment of the invention.

Some embodiments of methods of fabricating a substrate in accordance with the invention, for example in forming integrated circuitry, are described initially with reference to FIGS. 1-9. Referring to FIG. 1, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising material 12 which will ultimately be processed through a mask pattern formed thereover. Material 12 may be homogenous or non-homogenous, for example comprising multiple different composition regions and/or layers. Spaced first features 14 have been formed over substrate 12. Any suitable material is contemplated, and whether homogenous or non-homogenous. In the context of this document, "spaced" refers to the lateral direction as opposed to vertically or otherwise. Spaced first features 14 may be patterned/formed by any existing or yet-to-be-developed manner, with photolithographic patterning using photoresist (whether positive, negative or dual-tone resist resulting from single or multi-pattern lithography) being an example. Further, spaced first features 14 may be formed by any technique described below. In one example, spaced first features 14 may be in the form of elongated lines, for example running parallel one another over at least some portion of the substrate as would be viewed in a top-down view (not shown).

Figure 2:
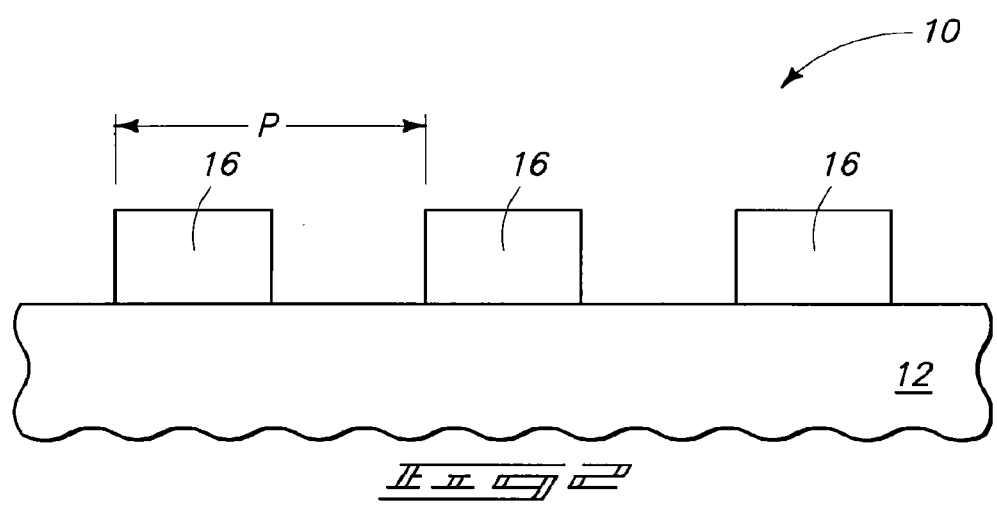
FIG. 2 is a view of the FIG. 1 substrate at a processing step prior to that of FIG. 1.

Further in one embodiment, spaced first features 14 may result from lateral etching/trimming of wider features. For example, FIG. 2 depicts substrate 10 at a processing step prior to that of FIG. 1. Such is shown as comprising spaced mask features 16, for example comprising, consisting essentially of, or consisting of photoresist, having been fabricated over substrate 12 in a repeating pattern of a pitch "P". Pitch P may be equal to, greater than, or less than the minimum photolithographic resolution with which substrate 10 is fabricated. Regardless, spaced mask features 16 of FIG. 2 have been laterally trimmed to reduce their respective widths to produce the example construction of FIG. 1 which comprises spaced first features 14. Such may be conducted by an isotropic etch which removes material approximately equally from the sides and tops of spaced mask features 16. Alternately, chemistry and conditions may be used which tend to etch greater material from the lateral sides of spaced mask features 16 than from the respective tops. Alternately, chemistries and conditions may be used which tend to etch greater material from the tops of spaced mask features 16 than from the lateral sides.

For example, the construction depicted by FIG. 1 can be derived by plasma etching the substrate of FIG. 2 within an inductively coupled reactor. Example etching parameters which will achieve essentially isotropic etching where material of spaced mask features 16 is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where material of spaced mask features 16 comprises photoresist, such will isotropically etch mask features 16 at a rate from about 0.2 nanometer per second to about 3 nanometers per second. While such an example etch is essentially isotropic, greater lateral etching of the spaced mask features will occur as two sides are laterally exposed as compared to only a single upper surface thereof.

If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm.

It may be desired that the stated etching provide greater removal from the top of the spaced mask features than from the sides, for example to either achieve equal elevation and width reduction or more elevation than width reduction. The example parameters for achieving greater etch rate in the vertical direction as opposed to the lateral direction include pressure from about 2 mTorr to about 20 mTorr, temperature from about 0° C. to about 100° C., source power from about 150 watts to about 300 watts, bias voltage at greater than or equal to about 200 volts, $Cl_2$ and/or HBr flow from about 20 sccm to about 100 sccm, and $O_2$ flow from about 10 sccm to about 20 sccm.

The example FIGS. 1 and 2 embodiments depict the respective features as having equal shapes and widths relative one another in the depicted cross section, as well as equal spacing therebetween. Such is not, however, required in this or other embodiments.

Figure 3:
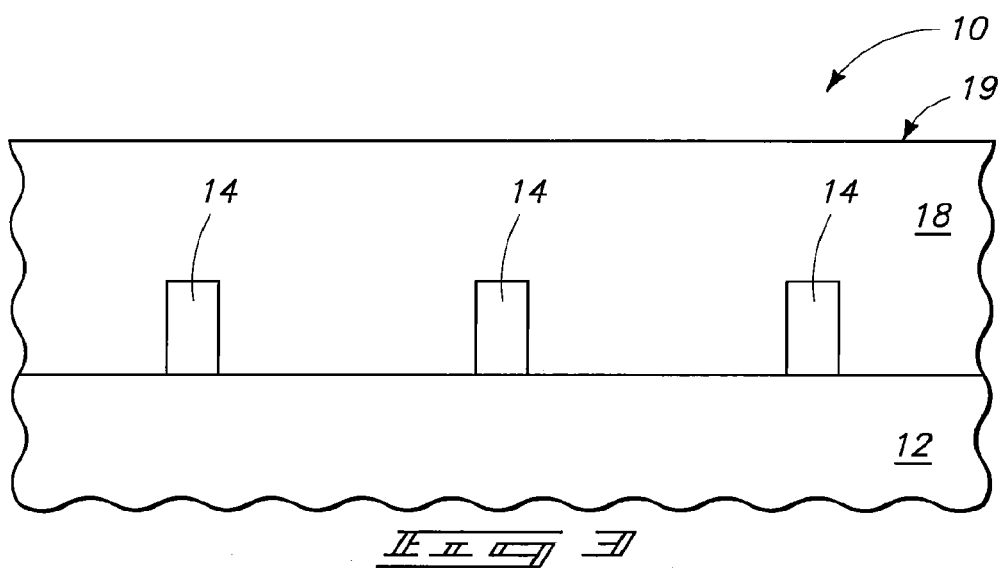
FIG. 3 is a view of the FIG. 1 substrate at a processing step subsequent to that shown by FIG. 1.

Referring to FIG. 3, an alterable material 18 has been formed over spaced first features 14. Alterable material 18 interacts selectively or uniformly with certain materials with which it forms an interface. Alterable material 18 may be cast onto a pre-patterned surface (for example as shown) and may be conformal or non-conformal. Casting via spin-casting, dip-casting, drop-casting, or similar, are examples. The alterable material will be altered with material from the spaced first features to form altered material on sidewalls of the spaced first features. The altered material may form spontaneously upon deposition of the alterable material, or be subsequently activated, for example via thermal, photonic, electronic, ionic (including acid-based chemistry) treatments, by way of examples only. Accordingly, the altering may occur during deposition and/or after deposition. In one embodiment, no altering occurs until after completion of the deposition of the alterable material. Further, the altering may be self-limiting in the case of a limiting reagent or equilibrium conditions, or kinetically arrested if reactants are in excess. Alterable material 18 may have a planar outermost surface or a non-planar outermost surface, with an example planar outermost surface 19 being depicted in FIG. 3. Alterable material 18 may or may not be homogenous.

Material 18 may be similar to a class of materials available from Clariant International, Ltd. as so-called "AZ R" materials, such as the materials designated as AZ R200™, AZ R500™ and AZ R600™. The "AZ R" materials contain organic compositions which cross-link upon exposure to acid released from chemically-amplified resist. Accordingly for example, such materials constitute an example alterable material where material of spaced first features 14 comprises chemically-amplified resist. More specifically, an "AZ R" material may be coated across photoresist, and subsequently the resist may be baked at a temperature of from about 100° C. to about 120° C. to diffuse acid from the resist into the alterable material to form chemical cross-links within regions of the alterable material proximate the resist. Portions of the material adjacent the resist are thus selectively hardened relative to other portions of material that are not sufficiently proximate the resist. The material may then be exposed to conditions which selectively remove the non-hardened portions relative to the hardened portions. Such removal may be accomplished utilizing, for example, 10% isopropyl alcohol in deionized water, or a solution marketed as "SOLUTION C™" by Clariant International, Ltd. Processes utilizing the "AZ R" materials are sometimes considered examples of RELACS (Resolution Enhancement Lithography Assisted by Chemical Shrink) processes.

A challenge with the "AZ R" materials is that they can be similar enough in composition to photoresist that it may be difficult to selectively remove photoresist relative to hardened "AZ R" materials. In one embodiment, alterable material 18 may be similar to the "AZ R" materials in that it may comprise a similar or identical organic composition which is altered (for instance, forms cross-links) upon exposure to one or more substances (for instance, acid) released from material 20 over which material 18 lies when the substrate is baked. However, unlike "AZ R" materials, material 18 may also contain one or more components dispersed in the organic composition which are provided to chemically change material 18 relative to material of features 14 (for example, photoresist in embodiments where material of features 14 may be selectively removed relative to material 18). Components which may be dispersed in an organic composition of a material 18 may include one or more of titanium, carbon, fluorine, bromine, silicon and germanium. Any carbon dispersed in the organic composition may be part of a carbide compound so it is chemically different from bulk carbon of the organic composition. Any fluorine and/or bromine may be, for example, comprised of hydrofluoric acid and hydrobromic acid. In some embodiments, the components dispersed in an organic composition of a material 18 include one or more inorganic components, such as, for example, silicon, germanium, metals (for instance, titanium, tungsten, platinum, etc.) and/or metal-containing compounds (for instance, metal nitride, metal silicide, etc.). The component of material 18 that is similar to "AZ R" materials may be referred to as an "AZ R"-type composition. Accordingly, in some embodiments, alterable material 18 may be considered to have one or more inorganic components dispersed in an organic "AZ R"-type composition. However, alterable material 18 may comprise other than organic and other than "AZ R"-type compositions, for example as explained below.

Figure 4:
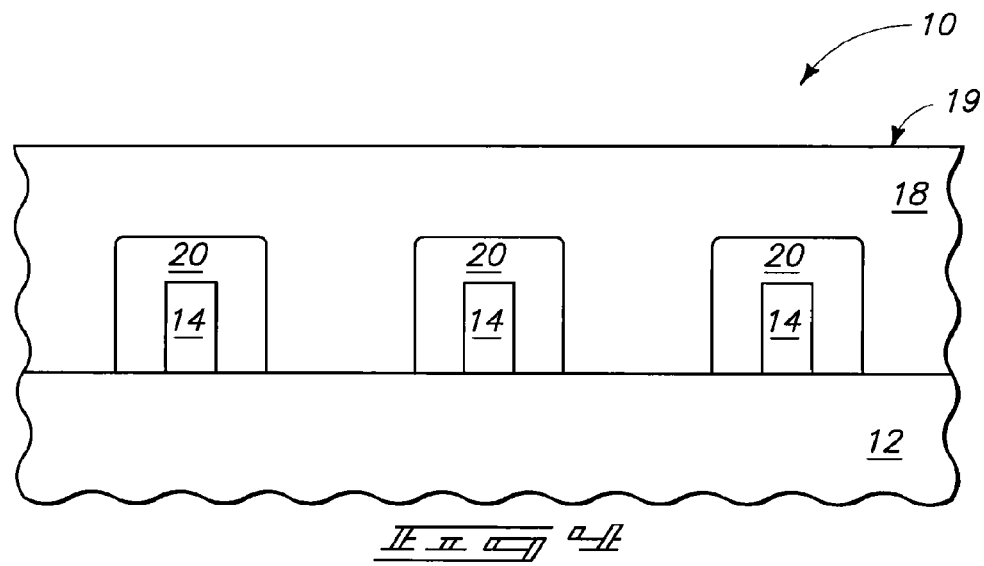
FIG. 4 is a view of the FIG. 3 substrate at a processing step subsequent to that shown by FIG. 3.

Referring to FIG. 4, substrate 10 has been subjected to conditions which cause inter-diffusion of materials 14 and 18 proximate spaced first features 14. Some substance of material 14 alters material 18 to form altered material 20 proximate spaced first features 14. Accordingly, the alterable material is capable of being altered with material from the first spaced features to form altered material on sidewalls of the spaced first features, for example as shown in FIG. 4. In one embodiment, the altering alters a portion of the alterable material 18 adjacent each of spaced first features 14 to form altered material 20 while leaving portions of the alterable material distal to spaced second features unaltered. FIG. 4 also depicts an embodiment wherein altered material 20 has been formed elevationally over spaced first features 14. Alterable material 20 may or may not be homogenous.

In some embodiments, material of spaced first features 14 comprises chemically-amplified photoresist, and the substance diffused from such photoresist which imparts the altering of material 18 is acid. The acid may be caused to be released from photoresist by baking semiconductor substrate 10 at a temperature of at least about 100° C. The acid forms cross-links with "AZ R"-type composition of material 18. The amount of cross-linking, and the distance that the cross-linking spreads from spaced features 14 may be adjusted by modifying one or both of bake time and bake temperature.

As an additional example where spaced features 14 comprise silicon, an example alterable material 18 is a refractory metal, such as titanium, to result in a reaction ultimately to form the altered material to comprise a metal silicide. Such by way of example only is shown and described in U.S. Patent Application Publication No. US 2007/0049030. Additional alterable materials depending at least in part upon the composition of the spaced second features are also of course contemplated, and whether existing or yet-to-be developed.

Figure 5:
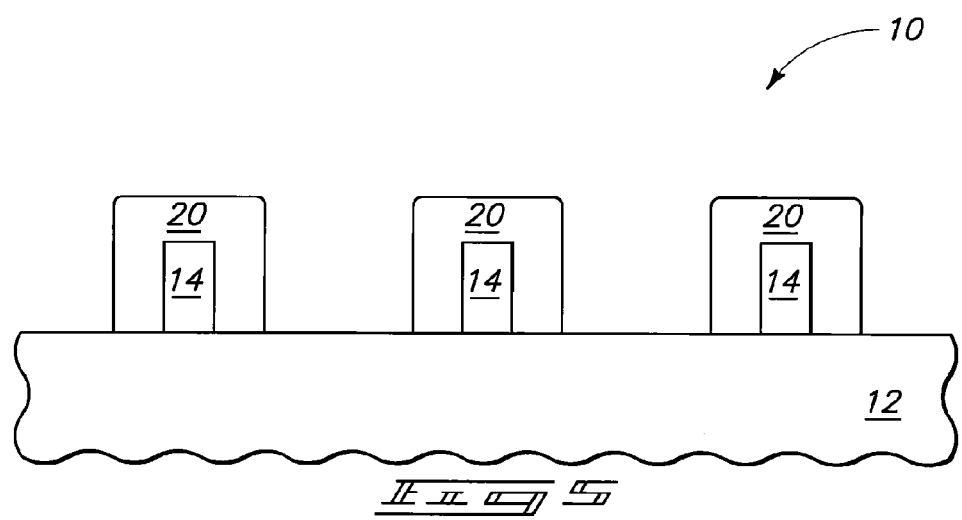
FIG. 5 is a view of the FIG. 4 substrate at a processing step subsequent to that shown by FIG. 4.

Referring to FIG. 5, and in one embodiment, un-reacted distal portions of material 18 (not shown) which were not altered to form material 20 have been removed, for example by etching, selectively relative to altered material 20. Suitable chemistries and conditions may be selected by the artisan depending upon composition of materials 18, 20 and 12. For example with respect to the "AZ R"-type compositions referred to above, such removal may be accomplished utilizing isopropyl alcohol and/or SOLUTION C™ as discussed above. Where material 18 may comprise additional components dispersed in an "AZ R"-type composition, such components may simply rinse away as the non-altered regions of material 18 are removed. Alternately, such additional components may be removed with solvents which remove the additional components. For instance, if silicon dioxide is utilized as a component of material 18, hydrofluoric acid may be utilized during removal of the non-altered regions of material 18 to ensure that the silicon dioxide of the non-altered regions is removed in addition to the "AZ R"-type composition of the non-altered regions.

Figure 6:
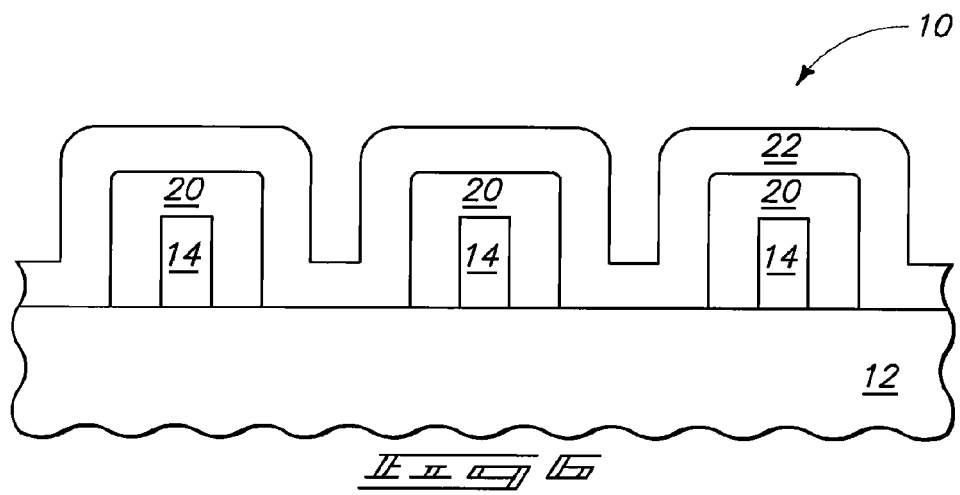
FIG. 6 is a view of the FIG. 5 substrate at a processing step subsequent to that shown by FIG. 5.

Referring to FIG. 6, a first material 22 has been deposited over altered material 20, and is of some different composition from that of altered material 20. First material 22 may be of some different composition from that of spaced first features 14, or may be of the same composition as that of spaced first features 14. Such may be conductive, semiconductive or insulative, including any combination thereof. Examples include silicon dioxide, silicon nitride, organic antireflective coatings, inorganic antireflective coatings, polysilicon, titanium or titanium nitride, including any combination thereof.

Referring to FIG. 7, first material 22 has been etched to expose altered material 20 and spaced second features 24 have been formed which comprise first material 22 received on sidewalls of altered material 20. In one embodiment, no etch mask other than first material 22 is received over any of first features 14 during the etching of first material 22. In one embodiment, no etch mask other than first material 22 is received over the substrate during the etching of first material 22. For purposes of the continuing discussion, FIG. 7 depicts respective closest pairs 25 of two immediately adjacent of second features 24 having a respective space between each two of a pair 25.

Referring to FIG. 8, altered material 20 (not shown) has been etched from between spaced second features 24 and spaced first features 14. Chemistries and etching conditions depending upon materials may be selected by the artisan in conducting each of the FIGS. 7 and 8 etchings. In one embodiment, no etch mask other than altered material 20 is received over any of first features 14 during the etching of altered material 20. In one embodiment, no etch mask other than altered material 20 is received over the substrate during the etching of altered material 20. Regardless, FIG. 8 depicts an embodiment wherein second features 24 are taller than first features 14. FIG. 8 depicts an example embodiment where a mask pattern 26 has been formed over substrate 12 and which comprises spaced first features 14 and spaced second features 24. Such also depicts an example embodiment wherein pairs 25 of immediately adjacent spaced second features 24 alternate with individual of spaced first features 14.

The above processing may be conducted, for example, to result in a pitch multiplication which may or may not be sub-lithographic. Regardless, the FIGS. 1-8 embodiments depict mask pattern 26 (FIG. 8) having been formed to have a pitch which is one-third (an integer factor of 3) that of pitch "P" of spaced mask features 16 in FIG. 2. Any degree of pitch reduction (including non-integer fractional reduction) in FIGS. 1-8, or otherwise, will of course be in large part determined on the degree of any lateral trimming that may occur of spaced features (for example in forming the substrate of FIG. 2 from that of FIG. 1) in combination with thickness of the deposited layers to produce the features and the spaces between features. For example, the thickness to which altered material 20 is formed in FIG. 3 and its ultimate removal impacts the space between adjacent features in the resultant mask pattern 26. Analogously, the deposition thickness of first material 22 in FIG. 6 in combination with the etching technique to produce the FIG. 7 construction impacts the width of spaced second features 24. Further and regardless, some or all of spaced second features 24 and/or spaced first features 14 may be further laterally trimmed after forming the FIG. 8 construction. Further by way of example, altered material 20 of FIG. 3 may be laterally trimmed.

The mask pattern comprising the spaced second features and the spaced third features is used to process the substrate received elevationally there-below through such mask pattern. Such processing may constitute any existing or yet-to-be developed technique, with etching and/or ion implanting being specific examples. FIG. 9 depicts one example with such processing wherein mask pattern 26 has been used as an etch mask while etching into material 12 of substrate 10.

Figure 10:
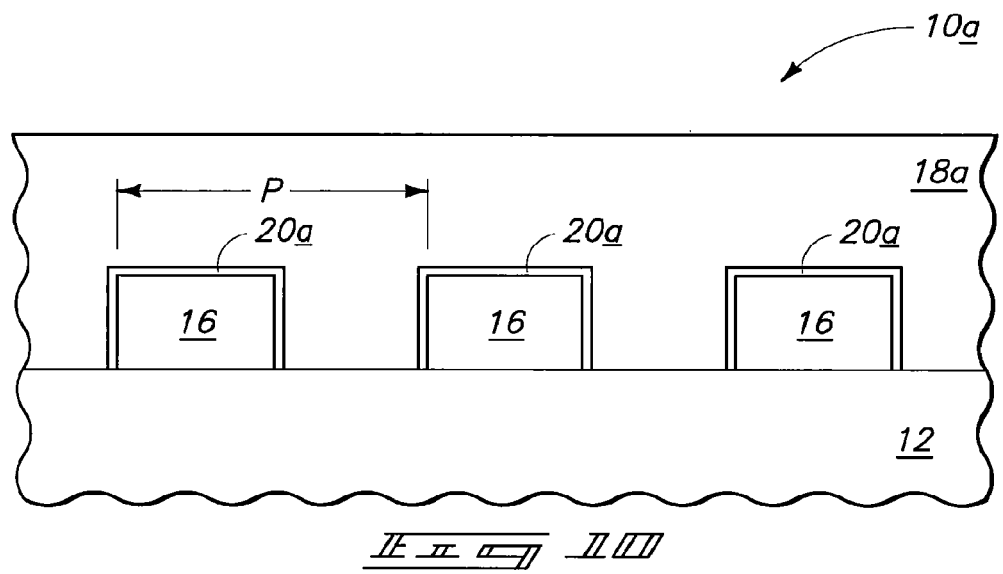
FIG. 10 is a diagrammatic sectional view of another substrate in process in accordance with an embodiment of the invention.

Additional embodiments are next described with reference to FIGS. 10-17. FIG. 10 depicts an alternate embodiment substrate fragment 10a corresponding in processing sequence to that of FIG. 4. Like numerals from the first-described embodiments have been utilized where appropriate, with construction differences being indicated with the suffix "a" or with different numerals. While the suffix "a" indicates different construction, example material for such constructions is the same as used in the above embodiments for the same numerals without the suffix "a". In FIG. 10, spaced first features 16 are received over substrate 12. Alterable material 18a has been altered to form altered material 20a of less thickness than that depicted in the embodiment of FIG. 4.

Figure 11:
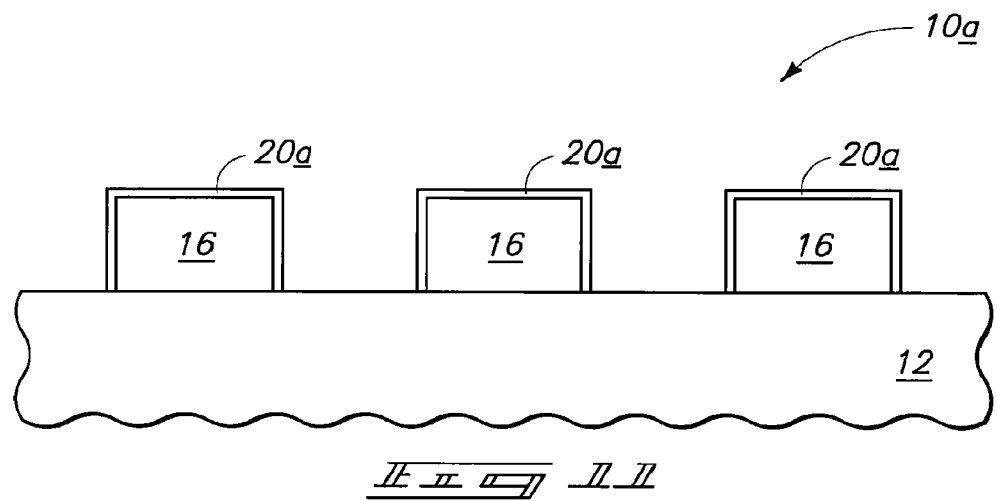
FIG. 11 is a view of the FIG. 10 substrate at a processing step subsequent to that shown by FIG. 10.

Referring to FIG. 11, un-reacted distal portions of material 18a (not shown) which were not altered to form material 20a have been removed, for example by etching, selectively relative to altered material 20a.

Figure 12:
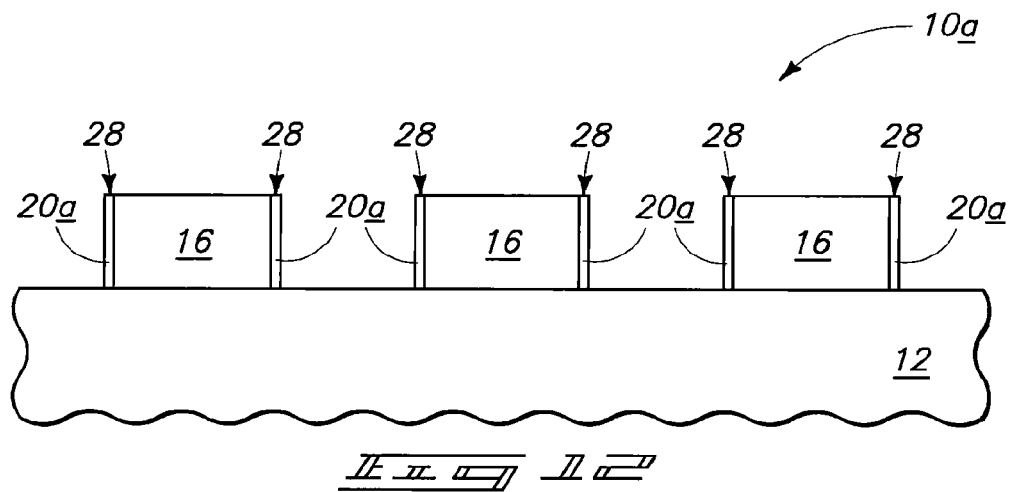
FIG. 12 is a view of the FIG. 11 substrate at a processing step subsequent to that shown by FIG. 11.

Referring to FIG. 12, altered material 20a has been anisotropically etched to form spacer features 28 comprising altered material 20a.

Figure 13:
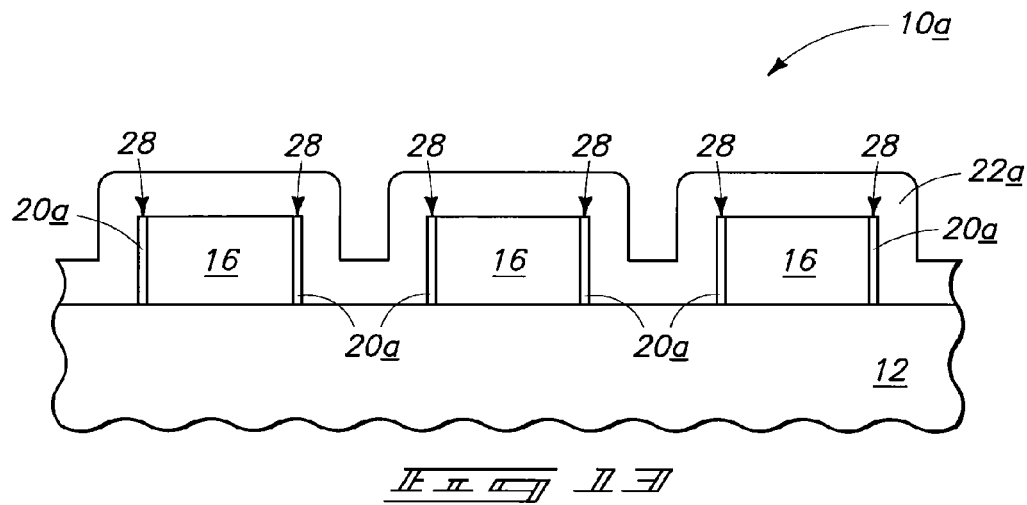
FIG. 13 is a view of the FIG. 12 substrate at a processing step subsequent to that shown by FIG. 12.

Referring to FIG. 13, first material 22a has been deposited over altered material 20a.

Figure 14:
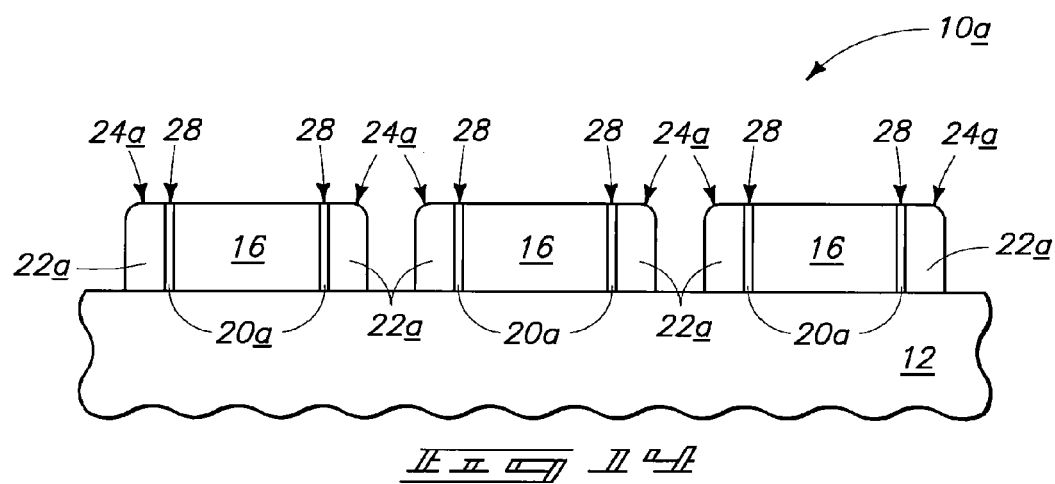
FIG. 14 is a view of the FIG. 13 substrate at a processing step subsequent to that shown by FIG. 13.

Referring to FIG. 14, first material 22a has been etched to expose altered material 20a of spacer features 28, and spaced second features 24a have been formed which comprise first material 22a on sidewalls of altered material 20a.

Figure 15:
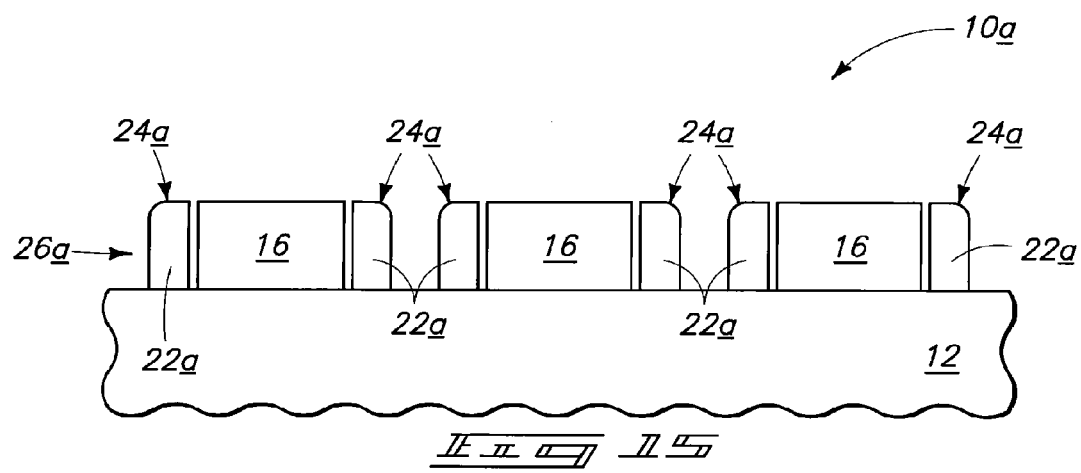
FIG. 15 is a view of the FIG. 14 substrate at a processing step subsequent to that shown by FIG. 14.
Figure 16:
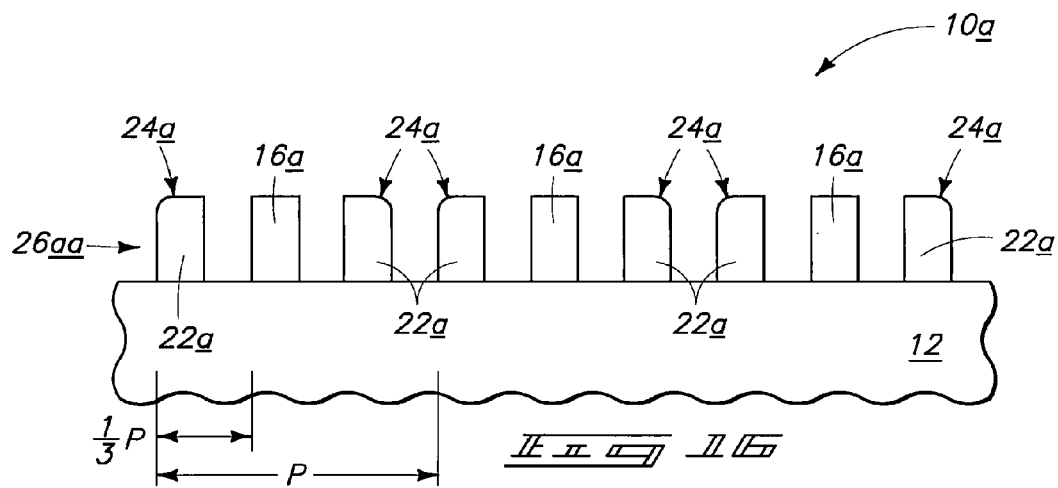
FIG. 16 is a view of the FIG. 15 substrate at a processing step subsequent to that shown by FIG. 15.

Referring to FIG. 15, altered material 20a (not shown) of spacer features 28 (not shown) has been etched from between spaced second features 24a and spaced first features 16, thereby producing a mask pattern 26a comprising spaced first features 16 and spaced second features 24a. Substrate 12 may be processed through mask pattern 26a. Regardless, FIG. 16 depicts alternate and/or additional processing to form a mask pattern 26aa regardless of whether processing substrate material 12 occurred with respect to mask pattern 26a of the FIG. 15 construction. Specifically, FIG. 16 depicts an example wherein spaced first features 16 of FIG. 15 have been laterally trimmed to reduce their respective widths, thereby forming spaced first features 16a after the etching has occurred of altered material 20a as depicted by the processing in going from FIGS. 14 to 15. Lateral trimming of mask features 16 of the FIG. 2 embodiment might be conducted additionally prior to deposition of alterable material 18. Further and regardless, one or both of spaced first features 16a and spaced second features 24a in FIG. 16 might additionally be laterally trimmed independent and regardless of whether processing of substrate material 12 occurs using mask pattern 26aa as a mask. FIG. 16 depicts first features 16a as being of the same width as first features 14 in FIGS. 1 and 8, although other shapes and sizes may result depending on the act and time of laterally trimming.

Figure 17:
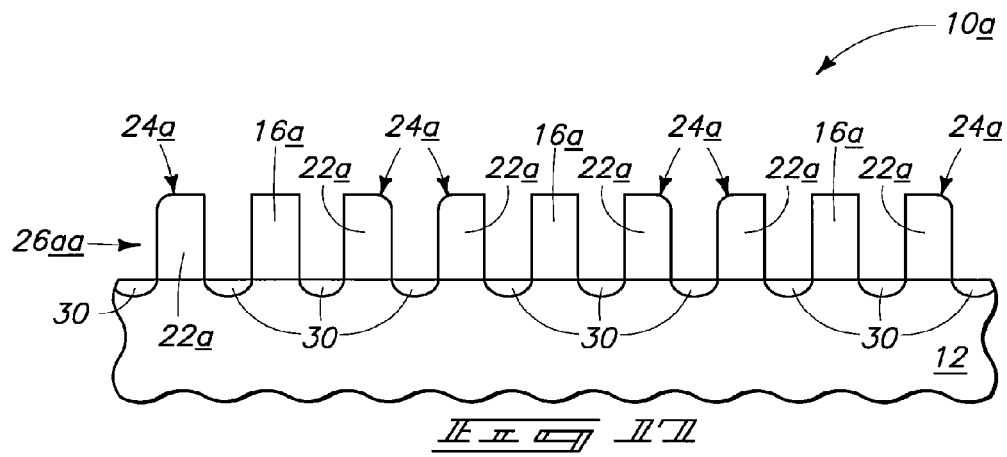
FIG. 17 is a view of the FIG. 16 substrate at a processing step subsequent to that shown by FIG. 16.

Referring to FIG. 17, substrate 12 has been processed through mask pattern 26aa. The example processing depicted in FIG. 17 is that of ion implantation, forming implanted regions 30.

Figure 18:
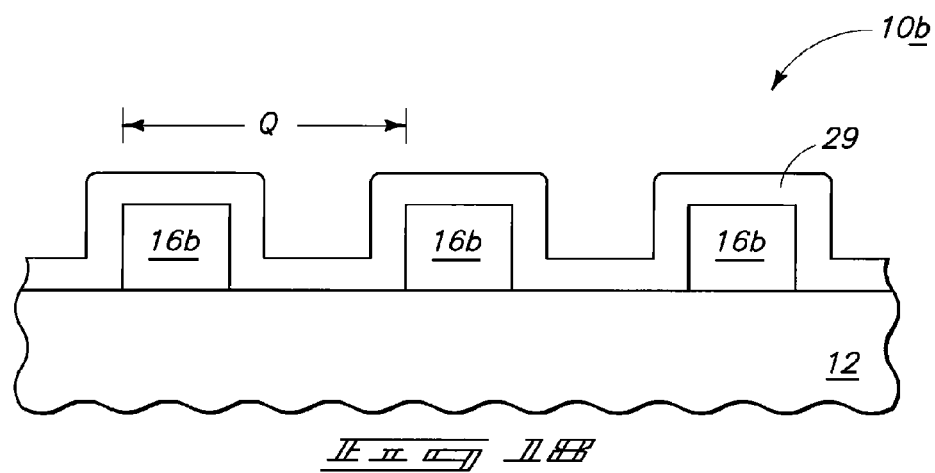
FIG. 18 is a diagrammatic sectional view of another substrate in process in accordance with an embodiment of the invention.

Additional embodiments of methods of fabricating a substrate are next described with reference to FIGS. 18-25 with respect to a substrate fragment 10b. Like numerals with respect to the above-described embodiments are utilized where appropriate, with differences in construction being indicated with the suffix "b" or with different numerals. While the suffix "b" indicates different construction, example material for such constructions is the same used in the above embodiments for the same numerals without the suffix "b". FIG. 18 depicts first features 16b having been formed over substrate 12. First features 14 from FIG. 1, or other construction features, might alternately be formed. A material 29 of some different composition from that of spaced first features 16b has been deposited. Examples include any of those described above for first material 22. Material 29 may or may not be homogenous.

Figure 19:
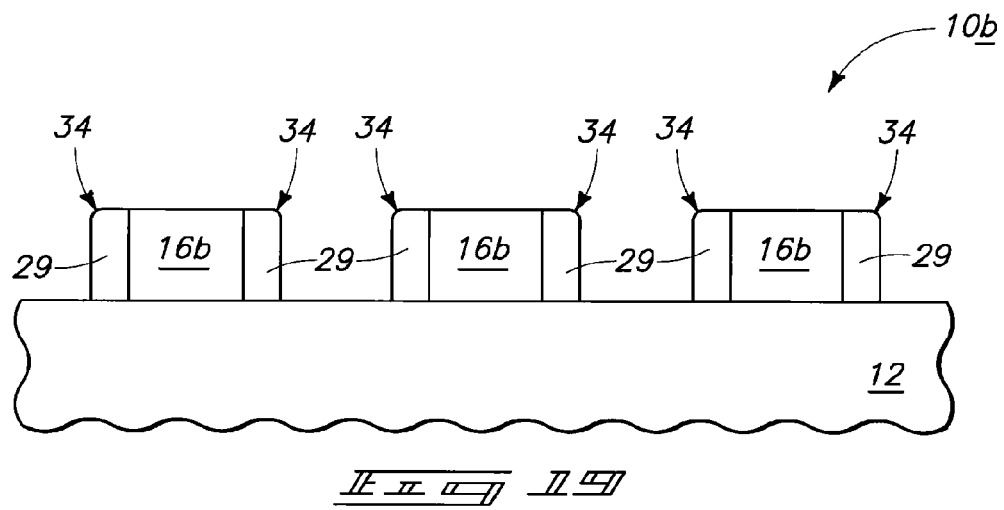
FIG. 19 is a view of the FIG. 18 substrate at a processing step subsequent to that shown by FIG. 18.

Referring to FIG. 19, material 29 has been anisotropically etched to form spacers 34 on sidewalls of spaced first features 16b.

Figure 20:
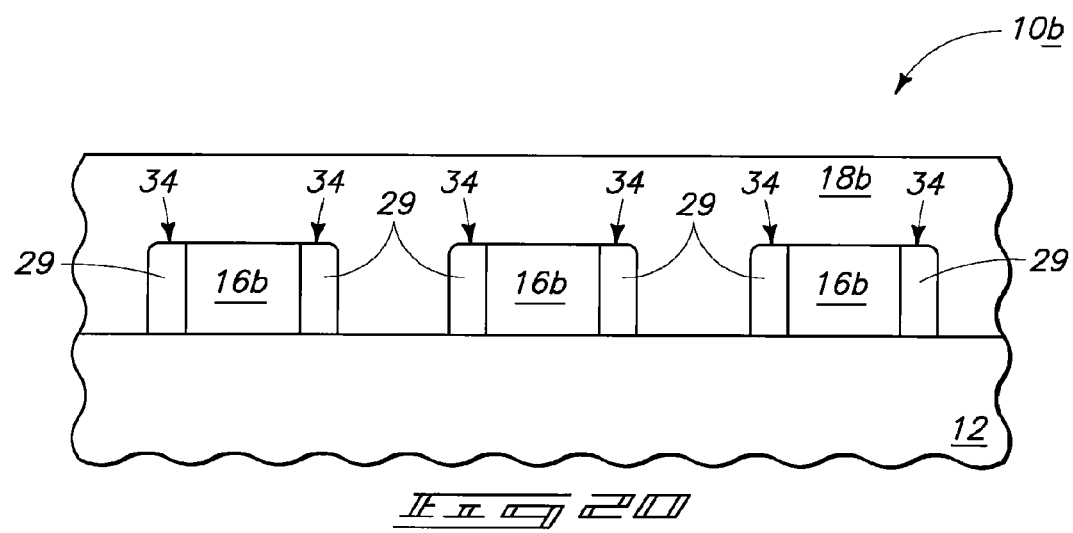
FIG. 20 is a view of the FIG. 19 substrate at a processing step subsequent to that shown by FIG. 19.

Referring to FIG. 20, an alterable material 18b has been deposited over anisotropically etched spacers 34.

Figure 21:
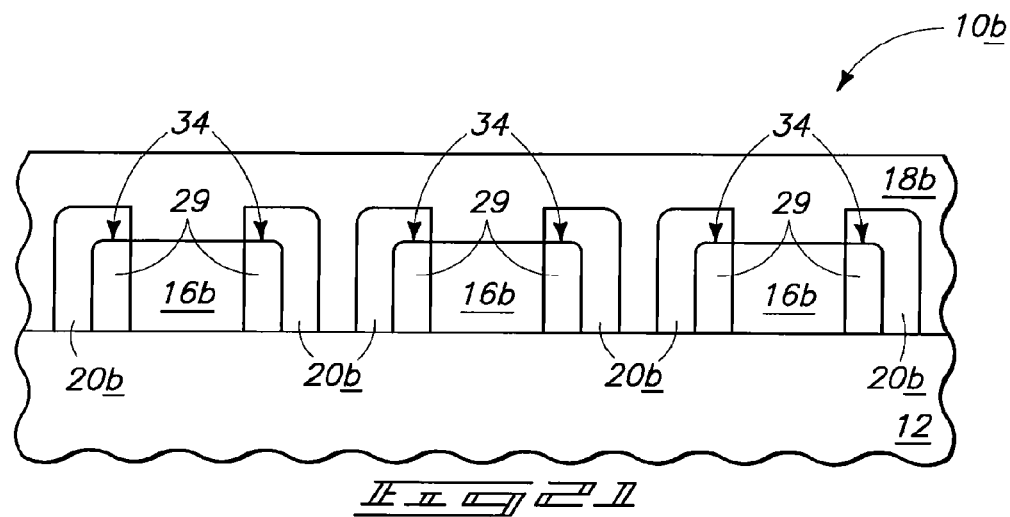
FIG. 21 is a view of the FIG. 20 substrate at a processing step subsequent to that shown by FIG. 20.

Referring to FIG. 21, alterable material 18b has been altered with material from anisotropically etched spacers 34 to form altered material 20b on a sidewall of each anisotropically etched spacer 34. FIG. 21 also depicts an embodiment wherein altered material 20b has been formed elevationally over spacers 34.

Figure 22:
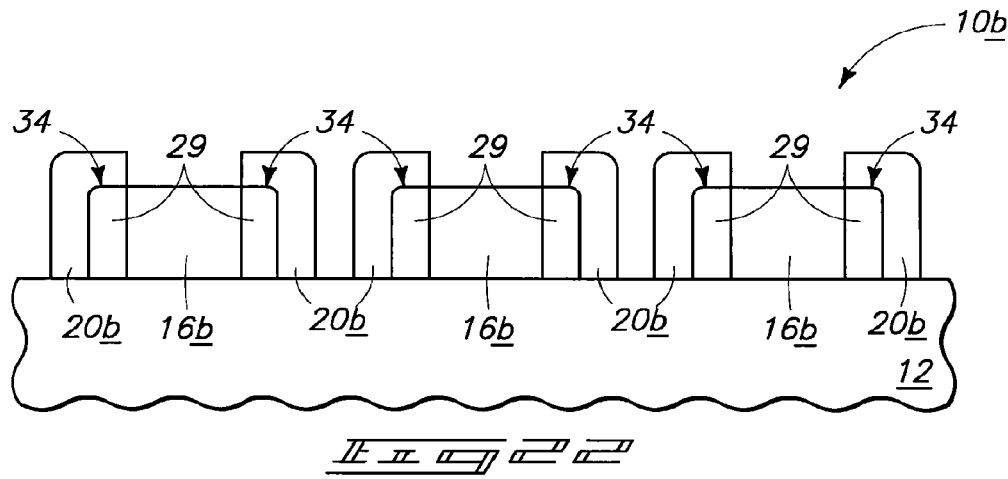
FIG. 22 is a view of the FIG. 21 substrate at a processing step subsequent to that shown by FIG. 21.

Referring to FIG. 22, un-reacted distal portions of material 18b (not shown) which were not altered to form altered material 20b have been removed, for example by etching, selectively relative to altered material 20b.

Figure 23:
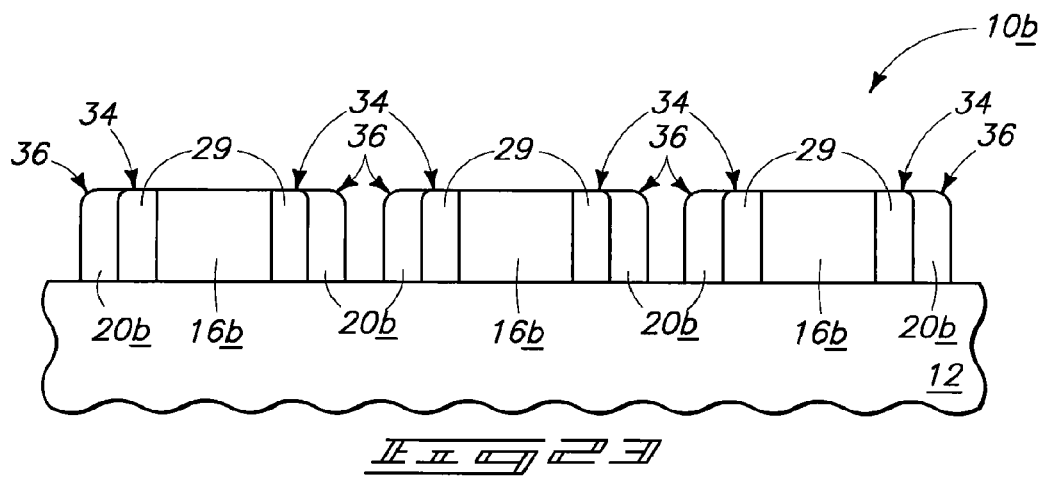
FIG. 23 is a view of the FIG. 22 substrate at a processing step subsequent to that shown by FIG. 22.

Referring to FIG. 23, altered material 20b has been anisotropically etched and spaced third features 36 comprising altered material 20b have been formed.

Figure 24:
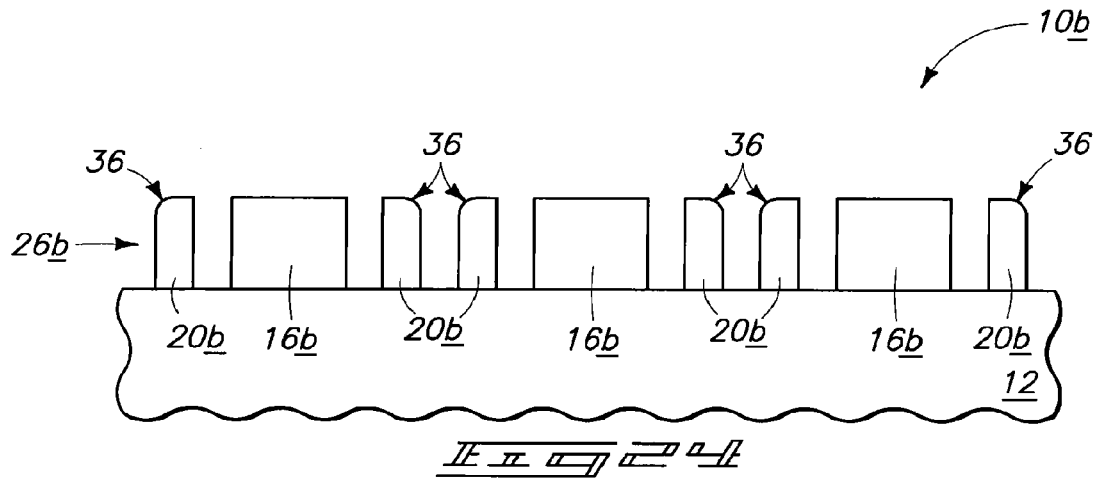
FIG. 24 is a view of the FIG. 23 substrate at a processing step subsequent to that shown by FIG. 23.

Referring to FIG. 24, anisotropically etched spacers 34 (not shown) have been removed from substrate 10b, thereby forming a mask pattern 26b comprising spaced first features 16b and spaced third features 36. Substrate material 12 may be processed through mask pattern 26b. Any of spaced first features 16b and spaced third features 34 may be laterally trimmed prior to and/or after conducting such processing. FIG. 25 depicts laterally trimming of spaced first features 16b of FIG. 24 to form spaced first features 16bb, and thereby a mask pattern 26bb. Further by way of example only as described above, spaced first features 16b of FIG. 18 may have been or may be laterally trimmed prior to deposition of material 29 and formation of spacers 34. Additionally by way of example only, spaced first features 16b might be laterally trimmed both prior to forming anisotropically etched spacers 34 and after removing such from the substrate.

FIGS. 26 and 27 depict an additional example embodiment substrate fragment 10c. Like numerals from the above-described embodiments have been utilized where appropriate, with construction differences being indicated with the suffix "c" or with different numerals. While the suffix "c" indicates different construction, example material for such construction is the same as used in the above embodiments for the same numerals without the suffix "c". FIG. 26 depicts alternate construction to that depicted by FIG. 23, and starting with a different substrate construction from that of FIG. 18 with respect to starting size and spacing of the spaced first features. In FIG. 26, spaced first features 16c have resulted from laterally trimming the initially formed mask features prior to deposition of material 29 in FIG. 18, and which is designated as 29c in FIG. 26. FIG. 27 depicts a mask pattern 26c after spacers 34c (not shown in FIG. 27) have been removed.

Additional embodiments are next described with reference to FIGS. 28-32 with respect to a substrate fragment 10d. Like numerals from the above-described embodiments have been utilized where appropriate, with construction differences being indicated with the suffix "d" or with different numerals. While the suffix "d" indicates different construction, example material for such construction is the same as used in the above embodiments for the same numerals without the suffix "d". Referring to FIG. 28, such depicts alternate processing to that shown by FIG. 6. Accordingly, the processing of FIGS. 1-5 has occurred wherein material 18 may be considered as first alterable material which was formed over spaced first features 14, and which was altered with material from spaced first features 14 to form a first altered material 20 on sidewalls of spaced first features 14. Such may be considered as forming spaced second features 50 (FIG. 28) comprising first altered material 20 and spaced first features 14. A second alterable material 52 has been formed over spaced second features 50. Composition and attributes of second alterable material 52 may be the same as that described above for alterable material 18 and depending at least in part on composition of outermost regions of spaced second features 50.

Referring to FIG. 29, second alterable material 52 has been altered with first altered material 20 from spaced second features 50 to form second altered material 54 on sidewalls of spaced second features 50. In the depicted example, such has also formed second altered material 54 to be received over tops of spaced second features 50. Composition and attributes of second altered material 54 are the same as that described above for altered material 20.

Referring to FIG. 30, unaltered second alterable material 52 (not shown) has been removed from the substrate selectively relative to second altered material 54.

Figure 31:
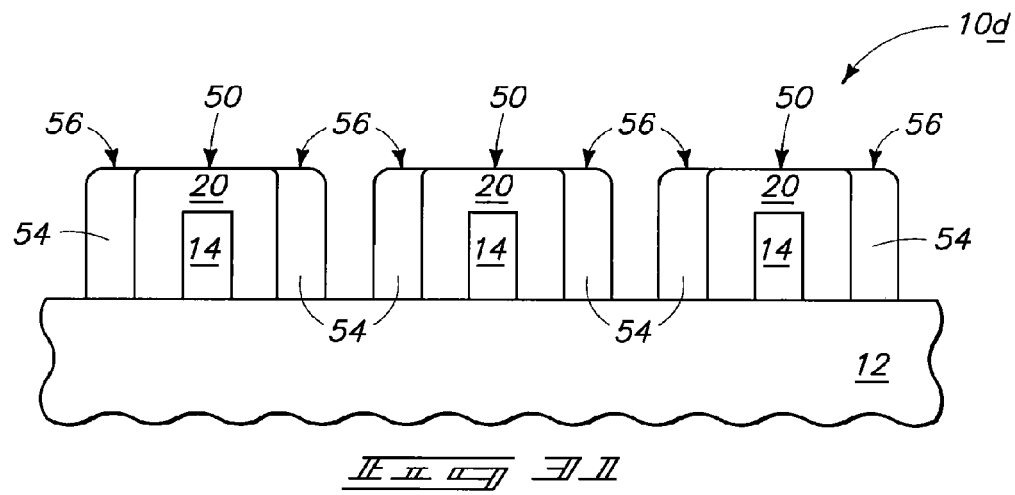
FIG. 31 is a view of the FIG. 30 substrate at a processing step subsequent to that shown by FIG. 30.

Referring to FIG. 31, spaced third features 56 have been formed which comprise second altered material 54. An example technique for doing so includes any substantially anisotropic etch, for example, conducted selectively relative to material 20 and material 12. In one embodiment, such may be conducted with no etch mask other than material 54 being received over spaced second features 50. In one embodiment, such may be conducted with no etch mask other than material 54 being received over the substrate.

Figure 32:
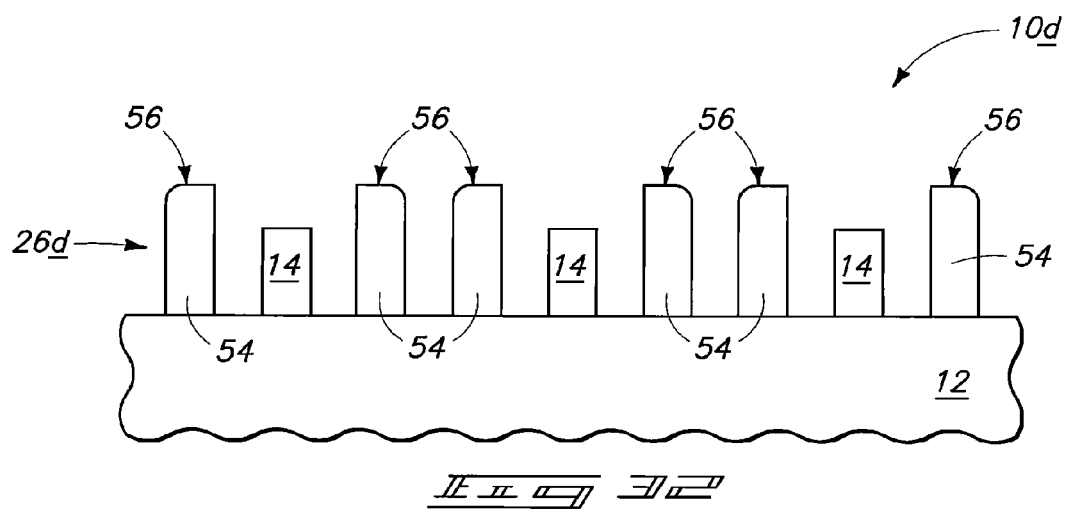
FIG. 32 is a view of the FIG. 31 substrate at a processing step subsequent to that shown by FIG. 31.

Referring to FIG. 32, first altered material 20 (not shown) has been etched from between spaced first features 14 and spaced third features 56, thereby producing a mask pattern 26d which comprises spaced first features 14 and spaced third features 56. In the depicted example, spaced third features 56 are taller than spaced first features 14. Substrate 12 is processed (not shown) through mask pattern 26d, for example as described in any of the above embodiments. Further, lateral trimming may occur of one or both of spaced first features 14 and spaced third features 56 prior to and/or after such processing. Likewise by way of example only, spaced first features 14 may be laterally trimmed prior to depositing the first alterable material, and/or after the etching of the first altered material.

Figure 33:
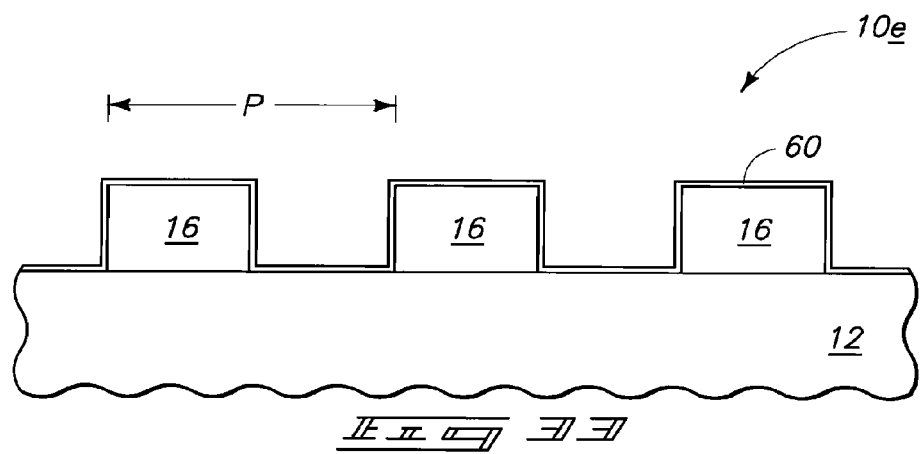
FIG. 33 is a diagrammatic sectional view of another substrate in process in accordance with an embodiment of the invention.

Additional embodiments are next described with reference to FIGS. 33-37 with respect to a substrate fragment 10e. Like numerals from the above-described embodiments have been utilized where appropriate, with construction differences being indicated with the suffix "e" or with different numerals. While the suffix "e" indicates different construction, example material for such constructions is the same as used in the above embodiments for the same numerals without the suffix "e". FIG. 33 depicts the substrate of FIG. 2 having spaced first features 16 formed over a substrate 12, and over which a first material 60 has been deposited. First material 60 is of some different composition from that of spaced first features 16. Example materials include any of those described above for material 22. FIG. 33 also depicts an example wherein first material 60 is deposited to a thickness which is less than that of spaced first features 16.

Figure 34:
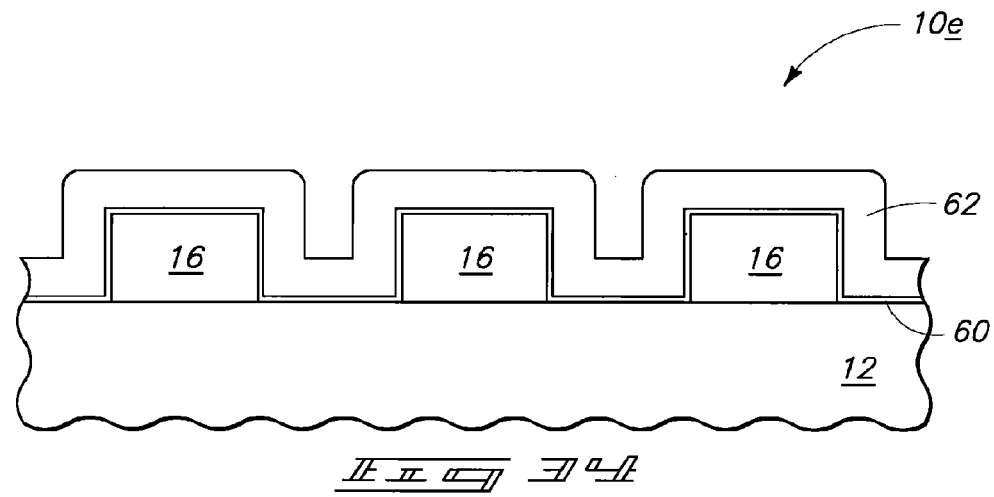
FIG. 34 is a view of the FIG. 33 substrate at a processing step subsequent to that shown by FIG. 33.

Referring to FIG. 34, a second material 62 has been deposited over first material 60, and is of some different composition from that of first material 60. Such may be of the same or different composition from that of spaced first features 16. Example materials include any of those described above for material 22.

Figure 35:
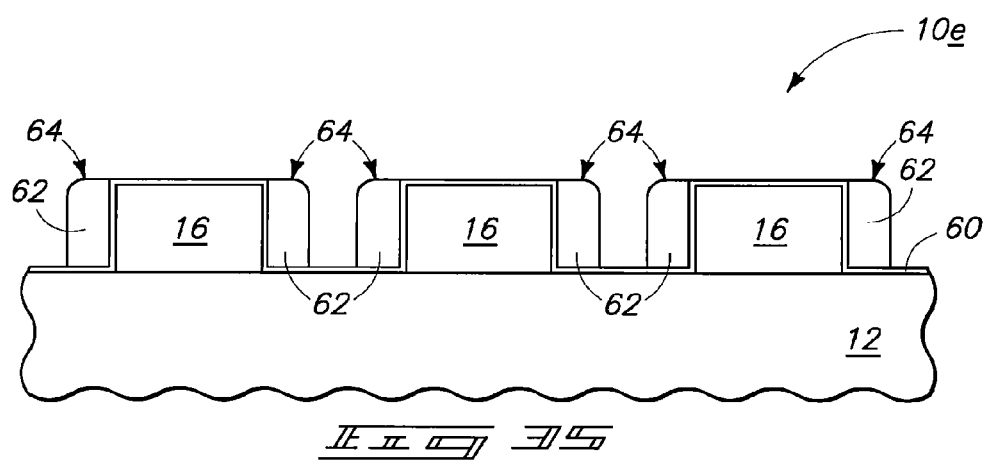
FIG. 35 is a view of the FIG. 34 substrate at a processing step subsequent to that shown by FIG. 34.

Referring to FIG. 35, second material 62 has been etched to expose first material 60, and two spaced second features 64 have been formed between adjacent spaced first features 16. Second features 64 are spaced from first features 16 at least by first material 60 received therebetween.

Figure 36:
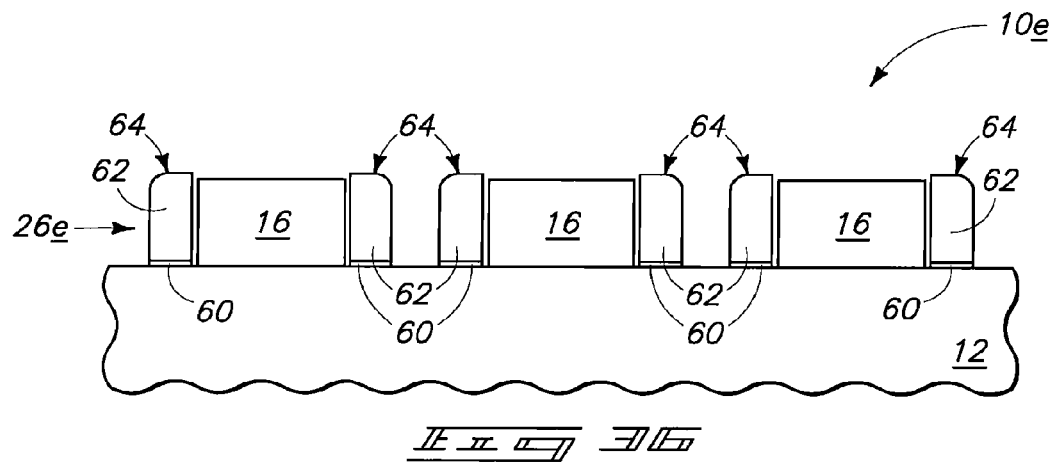
FIG. 36 is a view of the FIG. 35 substrate at a processing step subsequent to that shown by FIG. 35.

Referring to FIG. 36, first material 60 has been etched from between spaced first features 16 and spaced second features 64, whereby a mask pattern 26e has been formed. FIG. 36 depicts an example embodiment wherein spaced second features 64 are taller than spaced first features 16.

Referring to FIG. 37, the width of first features 16 of FIG. 36 has been laterally trimmed, thereby forming a mask pattern 26ee which comprises spaced first features 16e and spaced second features 64. FIGS. 33-37 depict example embodiments where second features 64 are fabricated to be of substantially uniform maximum width. The lateral trimming in FIG. 37 to produce the modified first features is also shown as producing a substantial uniform maximum first feature width that is substantially equal to the substantially uniform maximum width of the second features 64. Alternate constructions and/or additional processing are also of course contemplated. Analogous processing may be shown and used with any of the above-described embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of fabricating a substrate, comprising:
   forming spaced first features over a substrate, the spaced first features having elevationally coincident bases;
   depositing an alterable material over the spaced first features and altering the alterable material with material from the spaced first features to form altered material on sidewalls of the spaced first features and having an elevationally innermost base that is elevationally coincident with the bases of the spaced first features;
   depositing a first material over the altered material, the first material being of some different composition from that of the altered material;
   etching completely through the first material and elevationally inward at least to the elevation of the elevationally coincident bases to expose the substrate between the spaced first features and to expose the altered material, said etching completely through the first material to expose the substrate also forming spaced second features that comprise the first material on sidewalls of the altered material; and
   after forming the spaced second features, etching the altered material from between the spaced second features and the spaced first features.

2. The method of claim 1 wherein the spaced first features comprises photoresist.

3. The method of claim 1 wherein forming the spaced first features comprises forming spaced mask features followed by laterally trimming the spaced mask features to reduce their respective widths prior to depositing the alterable material.

4. The method of claim 1 wherein forming the spaced first features comprises forming spaced mask features followed by laterally trimming the spaced mask features to reduce their respective widths after the etching of the altered material.

5. The method of claim 1 wherein the first material is of some different composition from that of the spaced first features.

6. The method of claim 1 wherein the altering forms altered material over tops of the spaced first features.

7. The method of claim 1 wherein the alterable material has a planar outermost surface.

8. The method of claim 1 wherein the alterable material has a non-planar outermost surface.

9. The method of claim 1 wherein the altering occurs after completion of the deposition of the alterable material.

10. The method of claim 1 wherein no altering occurs until after completion of the deposition of the alterable material.

11. The method of claim 1 wherein the altering alters a portion of the alterable material adjacent each of the spaced first features to form the altered material while leaving portions of the alterable material distal the spaced first features unaltered.

12. The method of claim 1 wherein no etch mask other than the first material is received over any of the spaced first features during the etching of the first material.

13. The method of claim 12 wherein no etch mask is received anywhere over the substrate during the etching of the first material.

14. The method of claim 1 wherein no etch mask other than the altered material is received over any of the spaced first features during the etching of the altered material.

15. The method of claim 14 wherein no etch mask other than the altered material is received over the substrate during the etching of the altered material.

16. The method of claim 1 wherein the spaced first features comprise photoresist and the alterable material comprises one or more inorganic components dispersed in an organic composition that is cross-linkable upon exposure to acid, wherein the material from the spaced first features includes acid, and the altering the alterable material comprises forming cross-links within the organic composition upon exposure to the acid in the material from the spaced first features.

17. The method of claim 16 wherein the one or more inorganic components includes silicon.

18. The method of claim 16 wherein the one or more inorganic components includes metal.

19. A method of fabricating a substrate, comprising:
   forming spaced first features over a substrate;

depositing an alterable material over the spaced first features and altering the alterable material with material from the spaced first features to form altered material on sidewalls of the spaced first features;

depositing a first material over the altered material, the first material being of some different composition from that of the altered material and the same composition as that of the spaced first features;

etching completely through the first material and elevationally inward at least to the elevation of the elevationally coincident bases to expose the substrate between the spaced first features and to expose the altered material, said etching completely through the first material to expose the substrate also forming spaced second features that comprise the first material on sidewalls of the altered material; and after forming the spaced second features, etching the altered material from between the spaced second features and the spaced first features.

20. A method of fabricating a substrate, comprising:
forming spaced first features over a substrate;
depositing an alterable material over the spaced first features and altering the alterable material with material from the spaced first features to form altered material on sidewalls of the spaced first features, the altering occurring during deposition of the alterable material;
depositing a first material over the altered material, the first material being of some different composition from that of the altered material;
etching the first material to expose the altered material and forming spaced second features comprising the first material on sidewalls of the altered material; and
after forming the spaced second features, etching the altered material from between the spaced second features and the spaced first features.

21. The method of claim 20 wherein forming the spaced first features comprises forming spaced mask features followed by laterally trimming the spaced mask features to reduce their respective widths to greater than zero after the etching of the altered material.

22. The method of claim 20 wherein the first material is of the same composition as that of the spaced first features.

23. The method of claim 20 wherein the alterable material has a non-planar elevationally-outermost surface.

24. The method of claim 20 wherein after etching the altered material the second features are taller than the first features.

25. The method of claim 20 wherein respective laterally closest pairs of two immediately laterally adjacent of the second features have a respective void space laterally therebetween.

26. A method of fabricating a substrate, comprising:
forming spaced first features over a substrate;
depositing an alterable material over the spaced first features and altering the alterable material with material from the spaced first features to form altered material on sidewalls of the spaced first features, the altering alters a portion of the alterable material adjacent each of the spaced first features to form the altered material while leaving portions of the alterable material distal the spaced first features unaltered;
depositing a first material over the altered material, the first material being of some different composition from that of the altered material, etching the distal portions away selectively relative to the altered material prior to the depositing of the first material;

etching completely through the first material and elevationally inward at least to the elevation of the elevationally coincident bases to expose the substrate between the spaced first features and to expose the altered material, said etching completely through the first material to expose the substrate also forming spaced second features that comprise the first material on sidewalls of the altered material; and after forming the spaced second features, etching the altered material from between the spaced second features and the spaced first features.

27. A method of forming a pattern on a substrate, comprising:
forming spaced first features over a substrate;
depositing an alterable material over the spaced first features and altering the alterable material with material from the spaced first features to form altered material on sidewalls of the spaced first features;
depositing a first material over the altered material, the first material being of some different composition from that of the altered material;
etching the first material to expose the altered material and forming spaced second features comprising the first material on sidewalls of the altered material; and
after forming the spaced second features, etching the altered material from between the spaced second features and the spaced first features, a resultant pattern after etching the altered material having pitch of about one third that of the spaced first features.

28. A method of fabricating a substrate, comprising:
forming spaced first features over a substrate;
forming anisotropically etched spacers on sidewalls of the spaced first features;
depositing an alterable material over the anisotropically etched spacers and altering the alterable material with material from the anisotropically etched spacers to form altered material on a sidewall of each of the anisotropically etched spacers; and
after the altering, removing the anisotropically etched spacers from the substrate and forming spaced third features comprising the altered material.

29. The method of claim 28 comprising laterally trimming the spaced first features prior to said processing.

30. The method of claim 29 wherein the spaced first features are laterally trimmed prior to forming the anisotropically etched spacers.

31. The method of claim 29 wherein the spaced first features are laterally trimmed after removing the anisotropically etched spacers from the substrate.

32. The method of claim 29 wherein the spaced first features are laterally trimmed both prior to forming the anisotropically etched spacers and after removing the anisotropically etched spacers from the substrate.

33. A method of fabricating a substrate, comprising:
forming spaced first features over a substrate;
depositing a first alterable material over the spaced first features and altering the first alterable material with material from the spaced first features to form first altered material on sidewalls of the spaced first features;
forming spaced second features comprising the first altered material and the spaced first features;
depositing a second alterable material over the spaced second features and altering the second alterable material with the first altered material from the spaced second features to form second altered material on sidewalls of the spaced second features;

forming spaced third features comprising the second altered material; and etching the first altered material from between the spaced first features and the spaced third features.

34. The method of claim 33 wherein the spaced third features are taller than the spaced first features.

35. The method of claim 33 wherein the spaced first features comprises photoresist.

36. The method of claim 35 wherein forming the spaced first features comprises forming spaced mask features followed by laterally trimming the spaced masking features to reduce their respective widths prior to depositing the first alterable material.

37. The method of claim 35 wherein forming the spaced first features comprises forming spaced mask features followed by laterally trimming the spaced masking features to reduce their respective widths after the etching of the first altered material.

38. A method of fabricating a substrate, comprising:

forming spaced first features over a substrate;

depositing a first material over the spaced first features which is of some different composition from that of the spaced first features, the first material being deposited to a thickness which is less than that of the spaced first features;

depositing a second material over the first material, the second material being of some different composition from that of the first material;

etching the second material to expose the first material and forming two spaced second features between adjacent spaced first features, the second features being spaced from the first features at least by first material received therebetween, the spaced second features comprising the first material elevationally under an elevationally innermost base of the second material;

etching the first material from between the spaced first features and the spaced second features; and after the etching of the first material, laterally trimming width of the first features.

39. The method of claim 38 wherein the first material is deposited to a thickness which is less than that of the spaced first features.

40. The method of claim 38 wherein the second features are of substantially uniform maximum width, the laterally trimming producing a substantially uniform maximum first feature width that is substantially equal to the substantially uniform maximum width of the second features.

41. A method of fabricating a substrate, comprising:

forming spaced first features over a substrate, the forming of the spaced first features comprising forming spaced mask features followed by laterally trimming the spaced mask features to reduce their respective widths prior to depositing the alterable material;

depositing an alterable material over the spaced first features and altering the alterable material with material from the spaced first features to form altered material on sidewalls of the spaced first features, the altering occurring during deposition of the alterable material;

depositing a first material over the altered material, the first material being of some different composition from that of the altered material;

etching the first material to expose the altered material and forming spaced second features comprising the first material on sidewalls of the altered material; and after forming the spaced second features, etching the altered material from between the spaced second features and the spaced first features.

* * * * *